(12) United States Patent
Xie et al.

(10) Patent No.: US 11,177,258 B2
(45) Date of Patent: Nov. 16, 2021

(54) STACKED NANOSHEET CFET WITH GATE ALL AROUND STRUCTURE

(71) Applicant: International Business Machines Corporation, Armonk, NY (US)

(72) Inventors: Ruilong Xie, Niskayuna, NY (US); Alexander Reznicek, Troy, NY (US); Heng Wu, Guilderland, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/798,316

(22) Filed: Feb. 22, 2020

(65) Prior Publication Data
US 2021/0265345 A1    Aug. 26, 2021

(51) Int. Cl.
*H01L 29/66* (2006.01)
*H01L 29/423* (2006.01)
(Continued)

(52) U.S. Cl.
CPC .... *H01L 27/0922* (2013.01); *H01L 21/02164* (2013.01); *H01L 21/02167* (2013.01);
(Continued)

(58) Field of Classification Search
CPC ........... H01L 29/0665; H01L 29/66439; H01L 29/0673; H01L 29/78696; H01L 27/0924;
(Continued)

(56) References Cited

U.S. PATENT DOCUMENTS 10,026,652 B2    7/2018 Wang et al.
10,090,193 B1    10/2018 Chanemougame et al.
(Continued)

OTHER PUBLICATIONS

J. Ryckaert et al., "The Complementary FET (CFET) for CMOS scaling beyond N3," Symposium on VLSI Technology, Jun. 2018, pp. 141-142.
(Continued)

*Primary Examiner* — Brian Turner
(74) *Attorney, Agent, or Firm* — Jeffrey S. La Baw; Michael J. Chang, LLC

(57) ABSTRACT

CFET devices having a gate-all-around structure are provided. In one aspect, a method of forming a CFET device includes: forming a nanosheet device stack(s) on a substrate including alternating first/second nanosheets of a first/second material, wherein lower nanosheets in the nanosheet device stack(s) are separated from the substrate and from upper nanosheets in the nanosheet device stack(s) by sacrificial nanosheets; forming a ζ-shaped dielectric spacer separating the lower and upper nanosheets; forming lower/upper source and drains on opposite sides of the lower/upper nanosheets, separated by an isolation spacer; selectively removing the first nanosheets; and forming a first gate surrounding a portion of each of the lower nanosheets including a first workfunction-setting metal(s), and a second gate surrounding a portion of each of the upper nanosheets including a second workfunction-setting metal(s), wherein the first and second workfunction-setting metals are separated by the ζ-shaped dielectric spacer. A CFET device is also provided.

20 Claims, 26 Drawing Sheets

(51) Int. Cl.

| | |
|---|---|
| *H01L 21/8238* | (2006.01) |
| *H01L 29/06* | (2006.01) |
| *H01L 29/786* | (2006.01) |
| *H01L 27/092* | (2006.01) |
| *H01L 29/49* | (2006.01) |
| *H01L 21/02* | (2006.01) |
| *H01L 21/3065* | (2006.01) |
| *H01L 21/28* | (2006.01) |

(52) U.S. Cl.
CPC .. *H01L 21/02183* (2013.01); *H01L 21/02186* (2013.01); *H01L 21/02532* (2013.01); *H01L 21/02603* (2013.01); *H01L 21/28088* (2013.01); *H01L 21/3065* (2013.01); *H01L 21/823807* (2013.01); *H01L 21/823814* (2013.01); *H01L 21/823842* (2013.01); *H01L 21/823864* (2013.01); *H01L 21/823878* (2013.01); *H01L 29/0653* (2013.01); *H01L 29/0673* (2013.01); *H01L 29/42392* (2013.01); *H01L 29/4908* (2013.01); *H01L 29/4966* (2013.01); *H01L 29/6656* (2013.01); *H01L 29/66545* (2013.01); *H01L 29/66742* (2013.01); *H01L 29/78618* (2013.01); *H01L 29/78696* (2013.01)

(58) Field of Classification Search
CPC ........... H01L 21/823864; H01L 27/092; H01L 29/42376
See application file for complete search history.

(56) References Cited

U.S. PATENT DOCUMENTS

| | | |
|---|---|---|
| 10,192,819 B1 | 1/2019 | Chanemougame et al. |
| 10,192,867 B1 | 1/2019 | Frougier et al. |
| 10,236,217 B1 | 3/2019 | Ando et al. |
| 10,304,832 B1* | 5/2019 | Chanemougame ......................... H01L 21/823828 |
| 10,418,449 B2 | 9/2019 | Paul et al. |
| 2016/0163796 A1 | 6/2016 | Obradovic et al. |
| 2017/0221708 A1 | 8/2017 | Bergendahl et al. |
| 2019/0319095 A1* | 10/2019 | Zhang ................. H01L 27/1203 |
| 2020/0035569 A1* | 1/2020 | Frougier ................ B82Y 10/00 |
| 2020/0266192 A1* | 8/2020 | Ju ....................... H01L 27/0886 |

OTHER PUBLICATIONS

N. Loubet et al., "Stacked nanosheet gate-all-around transistor to enable scaling beyond FinFET," Symposium on VLSI Technology, Jun. 2017, pp. T230-T231.

J. Zhang et al., "High-k metal gate fundamental learning and multi-V t options for stacked nanosheet gate-all-around transistor," International Electron Devices Meeting (IEDM), Dec. 2017, p. 22.1.1 -22.1.4.

* cited by examiner

STACKED NANOSHEET CFET WITH GATE ALL AROUND STRUCTURE

FIELD OF THE INVENTION

The present invention relates to complementary field effect transistor (CFET) devices, and more particularly, to stacked nanosheet CFET devices having a gate-all-around structure.

BACKGROUND OF THE INVENTION

Stacked complementary field effect transistor (CFET) designs provide a significant gain for both logic and memory device structural scaling by stacking n-channel and p-channel FETs. The CFET design can be implemented in various different device structures including stacked nanowire, fin and nanosheet designs.

However, each of these structures presents some notable challenges. For instance, with nanowire-over-nanowire designs the cross-sectional area of each of the nanowire channels ends up being small and thus provides an inadequate effective channel width (Weff). Fin-over-fin designs increase the channel area. However, stacking the n-FET and p-FET fins further increases the overall fin height leading to poor mechanical stability because the fins are too tall. With nanosheet-over-nanosheet designs, workfunction-setting metal gate patterning is challenging.

Thus, stacked nanosheet CFET designs with improved workfunction-setting metal patterning techniques would be desirable.

SUMMARY OF THE INVENTION

The present invention provides stacked nanosheet complementary field effect transistor (CFET) devices having a gate-all-around structure. In one aspect of the invention, a method of forming a CFET device is provided. The method includes: forming at least one nanosheet device stack on a substrate including alternating first nanosheets of a first material and second nanosheets of a second material, wherein lower nanosheets in the at least one nanosheet device stack are separated from the substrate and from upper nanosheets in the at least one nanosheet device stack by sacrificial nanosheets; forming a zeta ($\zeta$)-shaped dielectric spacer separating the lower nanosheets from the upper nanosheets; forming lower source and drains on opposite sides of the lower nanosheets and upper source and drains on opposite sides of the upper nanosheets, separated from the lower source and drains by an isolation spacer; selectively removing the first nanosheets, forming gaps in the lower nanosheets and the upper nanosheets; and forming a first gate in the gaps surrounding a portion of each of the lower nanosheets in a gate-all-around configuration including at least one first workfunction-setting metal, and a second gate in the gaps surrounding a portion of each of the upper nanosheets in a gate-all-around configuration including at least one second workfunction-setting metal, wherein the at least one first workfunction-setting metal is separated from the at least one second workfunction-setting metal by the $\zeta$-shaped dielectric spacer.

In another aspect of the invention, a CFET device is provided. The CFET device includes: at least one nanosheet device stack disposed on a substrate; a $\zeta$-shaped dielectric spacer separating lower nanosheets in the at least one nanosheet device stack from upper nanosheets in the least one nanosheet device stack; lower source and drains on opposite sides of the lower nanosheets and upper source and drains on opposite sides of the upper nanosheets, separated from the lower source and drains by an isolation spacer; and a first gate surrounding a portion of each of the lower nanosheets in a gate-all-around configuration including at least one first workfunction-setting metal, and a second gate surrounding a portion of each of the upper nanosheets in a gate-all-around configuration including at least one second workfunction-setting metal, wherein the at least one first workfunction-setting metal is separated from the at least one second workfunction-setting metal by the $\zeta$-shaped dielectric spacer.

A more complete understanding of the present invention, as well as further features and advantages of the present invention, will be obtained by reference to the following detailed description and drawings.

DETAILED DESCRIPTION OF PREFERRED EMBODIMENTS

Provided herein are workfunction-setting metal patterning solutions for forming a true gate-all-around stacked nanosheet structure. By comparison, conventional designs have the nanosheets connected on one side for mechanical stability during fabrication, which is not a true gate-all-around structure. As will be described in detail below, the present stacked nanosheet complementary field effect transistor (CFET) devices have a true gate-all-around n-channel FET (NFET) over a true gate-all-around p-channel FET (PFET) or, alternatively, a true gate-all-around PFET over a true gate-all-around NFET. The gate-all-around NFET and PFET gate structures are fully isolated by a (lowercase) zeta ($\zeta$)-shaped dielectric.

Figure 1:
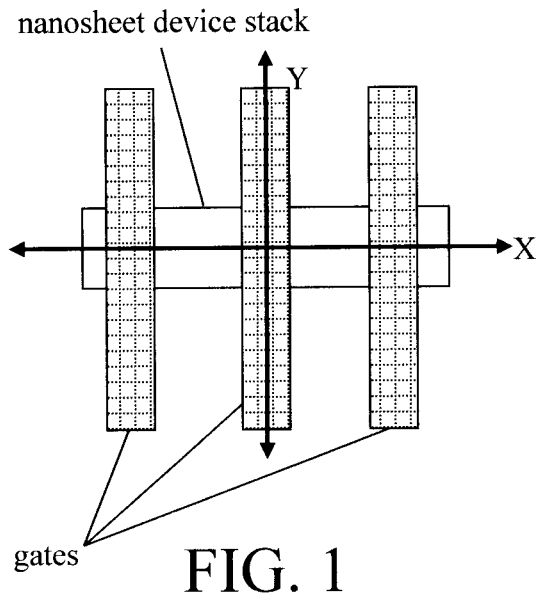
FIG. 1 is a top-down view of the general nanosheet complementary field effect transistor (CFET) design presented herein according to an embodiment of the present invention.

An exemplary methodology for forming a stacked nanosheet complementary field effect transistor (CFET) device having a gate-all-around structure is now described by way of reference to FIGS. 1-27. In each of the figures that follows, a cross-sectional view through a part of the nanosheet CFET device will be depicted. See, for example, FIG. 1 which is a top-down view of the general nanosheet CFET device design showing the orientations of the various cuts through the device that will be depicted in the figures. As shown in FIG. 1, the present nanosheet CFET device generally includes a nanosheet device stack. The lower nanosheets in the stack will form a device of a first polarity, i.e., a PFET or an NFET, and the upper nanosheets in the stack will form a device of a second/opposite polarity, i.e., an NFET if the lower device is a PFET, or vice versa. Gates of the CFET device are oriented orthogonal to the nanosheets. In FIG. 1, sacrificial gates are shown. As will be described in detail below, these sacrificial gates are later replaced with metal gates (also referred to herein as "replacement metal gates"). However, the orientation of the gates vis-à-vis the nanosheet stack is the same for the sacrificial and replacement metal gates.

As shown in FIG. 1, in one cross-sectional view X, cuts through the center of the nanosheet device stack (parallel to the nanosheets and perpendicular to the gates) will be provided. A cross-sectional view Y of cuts through the nanosheet device stack (perpendicular to the nanosheets and through the center of one of the gates) will also be provided.

Figure 2:
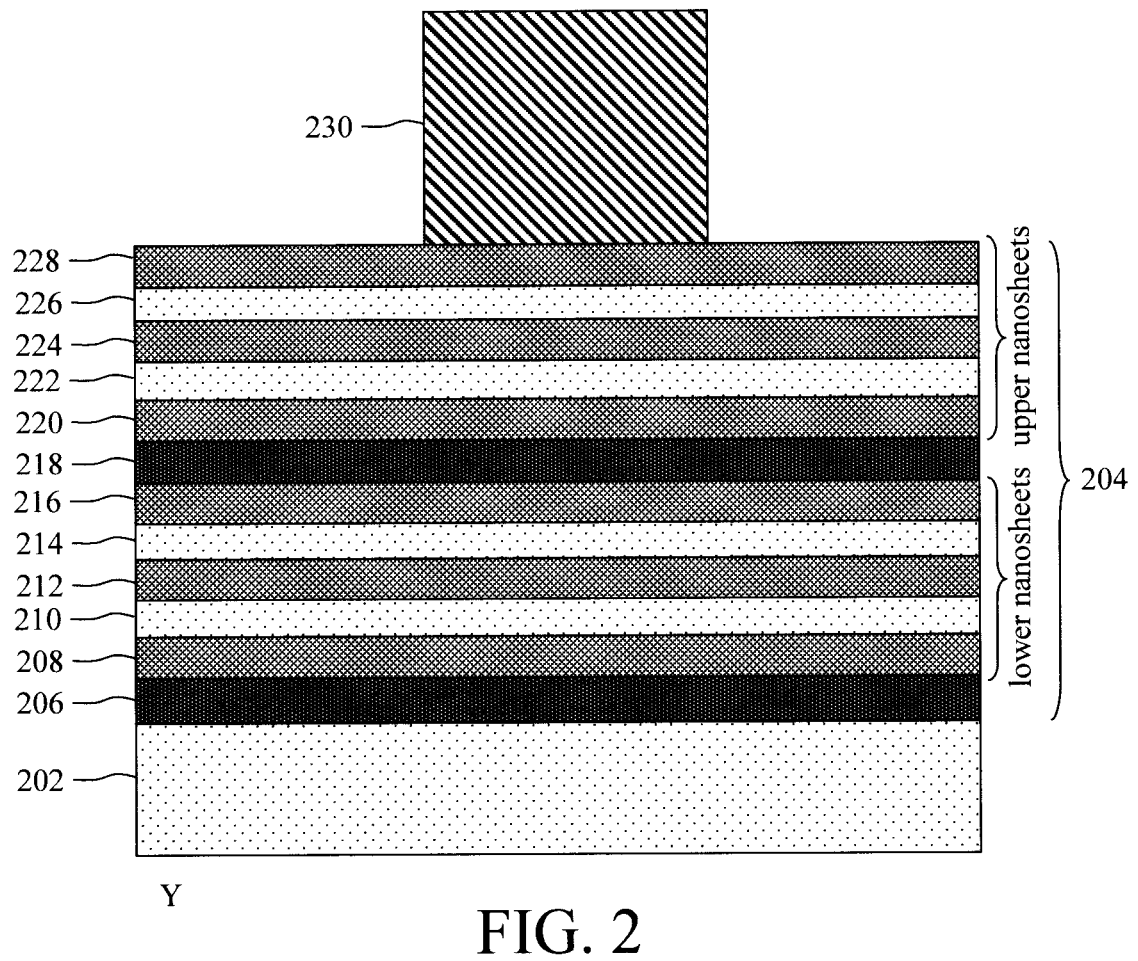
FIG. 2 is a diagram illustrating a nanosheet stack having been formed on a substrate and a patterned nanosheet hardmask having been formed on the nanosheets, the nanosheet stack having alternating first nanosheets of a first material and second nanosheets of a second material, with the lower nanosheets in the stack separated from the substrate and from the upper nanosheets in the stack by sacrificial nanosheets from a cross-sectional view perpendicular to the nanosheets according to an embodiment of the present invention.

The process begins with the formation of a nanosheet stack 204 on a substrate 202. See FIG. 2. FIG. 2 provides a cross-sectional view Y (see FIG. 1) through the device structure. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

Generally, the nanosheet stack 204 includes lower nanosheets 208-216, etc. separated from the substrate 202 by a (first) sacrificial nanosheet 206, and upper nanosheets 220-228, etc. separated from the lower nanosheets by a (second) sacrificial nanosheet 218. By 'sacrificial' it is meant that the layer, or portion thereof, is removed during fabrication of the device. By way of example only, each of the nanosheets 206-228 in stack 204 are deposited onto the substrate 202, one on top of the other, using an epitaxial growth process. According to an exemplary embodiment, each of the nanosheets 206-228 in stack 204 has a thickness of from about 10 nanometers (nm) to about 25 nm and ranges therebetween.

The lower nanosheets 208-216 in stack 204 include alternating layers of a first nanosheet material and a second nanosheet material. For instance, according to an exemplary embodiment, the first nanosheet material is SiGe, and the second nanosheet material is Si. In that case, lower nanosheet 208 is SiGe, lower nanosheet 210 is Si, lower nanosheet 212 is SiGe, lower nanosheet 214 is Si, and lower nanosheet 216 is SiGe. However, this is merely an example and other configurations are contemplated herein. For instance, in an alternative embodiment, the first nanosheet material is Si while the second nanosheet material is SiGe. As will be described in detail below, these nanosheet materials will be used to form the channels of the present CFET devices and a (sacrificial) material in between the channels. Removal of the latter releases the channels from the stack and permits gates to be formed that fully surround the channels in a gate-all-around configuration. Thus, it is preferable that the first and second nanosheet materials have etch selectivity with respect to one another. Thus, when one serves as the channels, the other (sacrificial) material can be selectively removed to release the channels from the stack. By way of example only, Si and SiGe provide such etch selectivity.

Similarly, the upper nanosheets 220-228 in stack 204 include alternating layers of the first nanosheet material and the second nanosheet material. For instance, when the first nanosheet material is SiGe and the second nanosheet material is Si, upper nanosheet 220 is SiGe, upper nanosheet 222 is Si, upper nanosheet 224 is SiGe, upper nanosheet 226 is Si, and upper nanosheet 228 is SiGe. Again, this is merely an example and other configurations are possible, e.g., the first nanosheet material can instead be Si while the second nanosheet material is SiGe. Further, the size of the stack 204 shown is merely an example, and embodiments are contemplated herein where the number of lower nanosheets and/or upper nanosheets differ from what is shown in the figures.

According to an exemplary embodiment, sacrificial nanosheets 206 and 218 are both formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, sacrificial nanosheets 206 and 218 are formed from SiGe60 (which has a Ge content of about 60%). Use of a higher Ge content SiGe will enable the sacrificial nanosheets 206 and 218 to be etched selective to the lower nanosheets 208-216 and upper nanosheets 220-228 in stack 204 which, as provided above, can be formed from Si and/or SiGe. Notably, however, the SiGe used as a lower/upper nanosheet material has a low Ge content. For example, in one exemplary embodiment, a low Ge content is from about 20% Ge to about 50% Ge and ranges therebetween. For instance, in one non-limiting example, lower nanosheet 208, lower nanosheet 212, lower nanosheet 216, upper nanosheet 220, upper nanosheet 224, and upper nanosheet 228 are formed from SiGe30 (which has a Ge content of about 30%).

As shown in FIG. 2, a patterned nanosheet hardmask 230 is then formed on the nanosheets marking the footprint and location of at least one individual nanosheet device stack. Suitable materials for the nanosheet hardmask 230 include, but are not limited to, nitride materials such as silicon nitride (SiN), silicon oxynitride (SiON), and/or silicon carbide nitride (SiCN), and/or oxide materials such as silicon oxide (SiOx).

Figure 3:
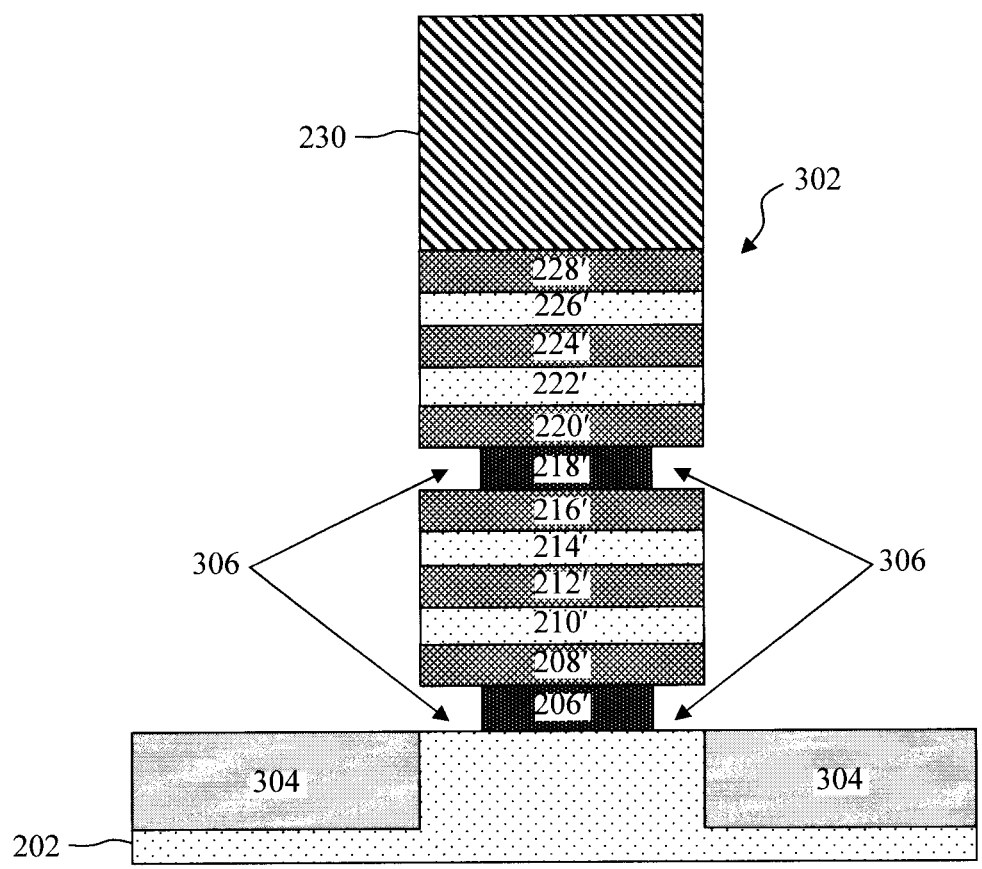
FIG. 3 is a diagram illustrating the nanosheet hardmask having been used to pattern the nanosheet stack into at least one individual nanosheet device stack, shallow trench isolation (STI) regions having been formed in the substrate at the base of the nanosheet device stack, and the sacrificial nanosheets having been etched to form divots adjacent to the sacrificial nanosheets along sidewalls of the nanosheet device stack from a cross-sectional view perpendicular to the nanosheets according to an embodiment of the present invention.

The nanosheet hardmask 230 is then used to pattern stack 204 into at least one individual nanosheet device stack 302. See FIG. 3. FIG. 3 provides a cross-sectional view Y (see FIG. 1) through the device structure. As shown in FIG. 3, nanosheet device stack 302 contains a patterned portion of each of the nanosheets from stack 204. For clarity, these layers as patterned are now designated with a prime (') symbol. For instance, the patterned portions of sacrificial nanosheets 206 and 218 are designated as 206' and 218', the patterned portions of lower nanosheets 208-216 are designated as 208'-216', and the patterned portions of upper nanosheets 220-228 are designated as 220'-228'.

As shown in FIG. 3, shallow trench isolation (STI) regions 304 are then formed in the substrate 202 at the base of the nanosheet device stack 302. According to an exemplary embodiment, STI regions 304 are formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

An etch is then performed to indent the sacrificial nanosheets 206' and 218', forming divots 306 adjacent to the sacrificial nanosheets 206' and 218' along the sidewalls of the nanosheet device stack 302. See FIG. 3. As provided above, according to an exemplary embodiment, sacrificial nanosheets 206' and 218' are formed from a high Ge content SiGe (e.g., from about 50% Ge to about 100% Ge and ranges therebetween) such as SiGe60. In that case, a non-directional (isotropic) etching process using a vapor phase dry gas chemistry such as HCl can be employed to etch sacrificial nanosheets 206' and 218' selective to the lower nanosheets 208'-216' and upper nanosheets 220'-228' of nanosheet device stack 302.

Figure 4:
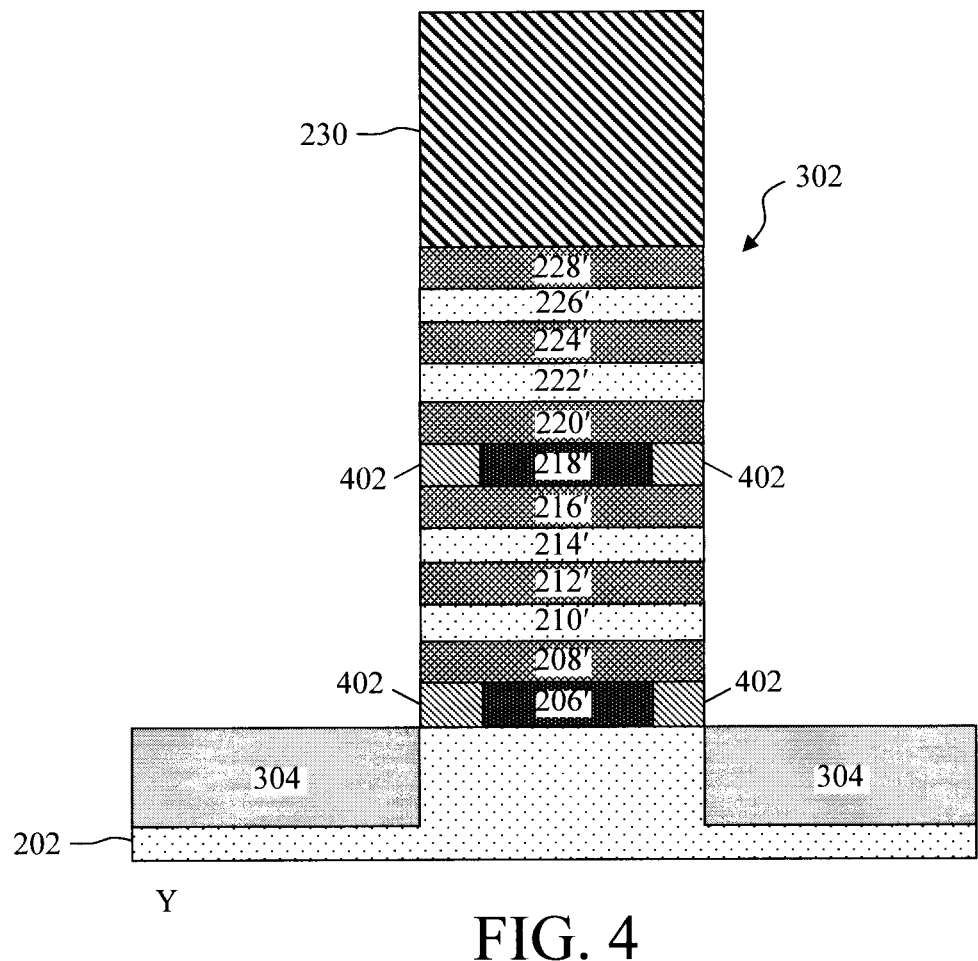
FIG. 4 is a diagram illustrating the divots along the nanosheet device stack sidewalls having been filled with a sacrificial spacer from a cross-sectional view perpendicular to the nanosheets according to an embodiment of the present invention.

The divots 306 along the nanosheet device stack 302 sidewalls are then filled with a sacrificial spacer 402. See FIG. 4. FIG. 4 provides a cross-sectional view Y (see FIG. 1) through the device structure. Suitable materials for sacrificial spacers 402 include, but are not limited to, metal oxides such as titanium oxide (TiO) and/or tantalum oxide (TaO). A process such as chemical vapor deposition (CVD), atomic layer deposition (ALD) or physical vapor deposition (PVD) can be employed to deposit the sacrificial spacer 402 material onto the nanosheet device stack 302 and filling the divots 306. An isotropic etching process such as a wet etch can be used to remove the excess material, forming the sacrificial spacers 402 shown in FIG. 4 in divots 306.

Figure 5:
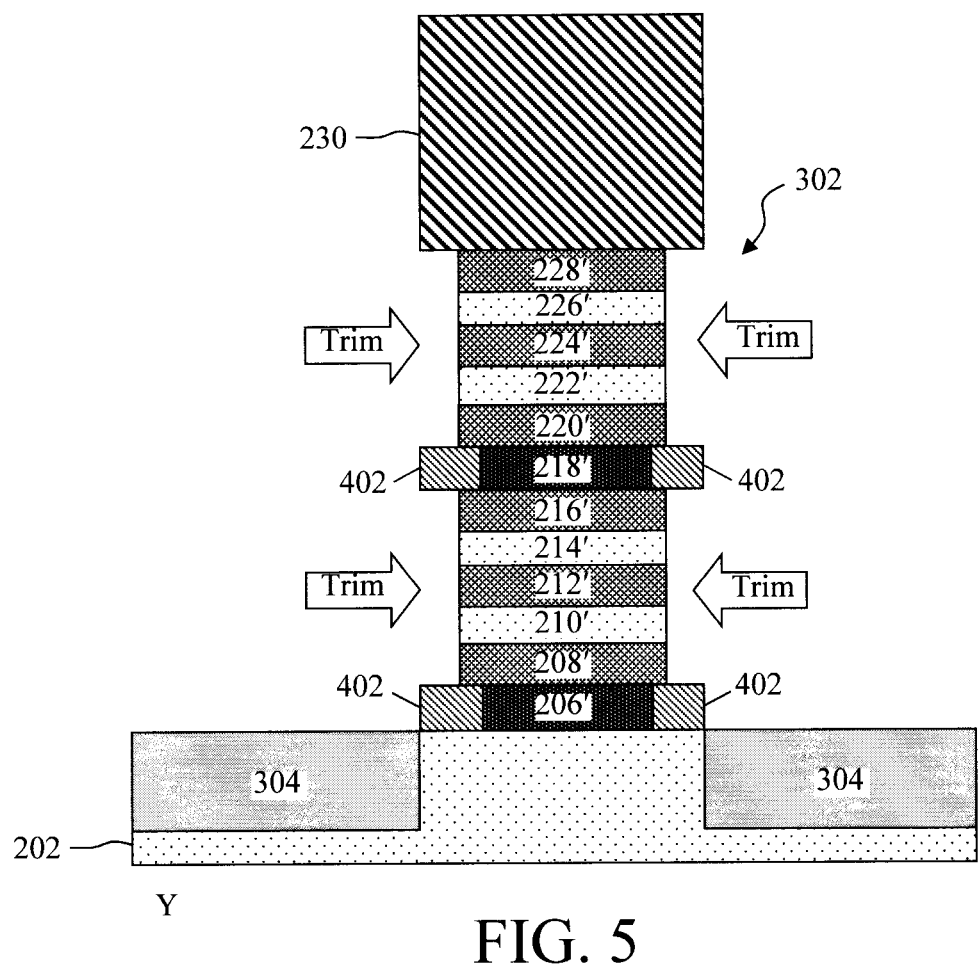
FIG. 5 is a diagram illustrating a lateral trimming of the lower nanosheets and upper nanosheets of the nanosheet device stack having been performed from a cross-sectional view perpendicular to the nanosheets according to an embodiment of the present invention.

With sacrificial spacers 402 in place covering/protecting the ends of the sacrificial nanosheets 206' and 218', a lateral trimming of the lower nanosheets 208'-216' and upper nanosheets 220'-228' of nanosheet device stack 302 is then performed. See FIG. 5. FIG. 5 provides a cross-sectional view Y (see FIG. 1) through the device structure. As shown in FIG. 5, this trimming occurs beneath the hardmask 230.

Further, as will become apparent from the description that follows, this lateral trimming of the lower/upper nanosheets and subsequent selective regrowth of the first nanosheet material (see below) will enable the channel nanosheets (i.e., lower nanosheets 210' and 214' and upper nanosheets 222' and 226' in this example) to be fully surrounded. Thus, when the first nanosheet material is later removed, these channel nanosheets will be fully released from stack 302 allowing for the formation of a true gate-all-around structure.

Figure 6:
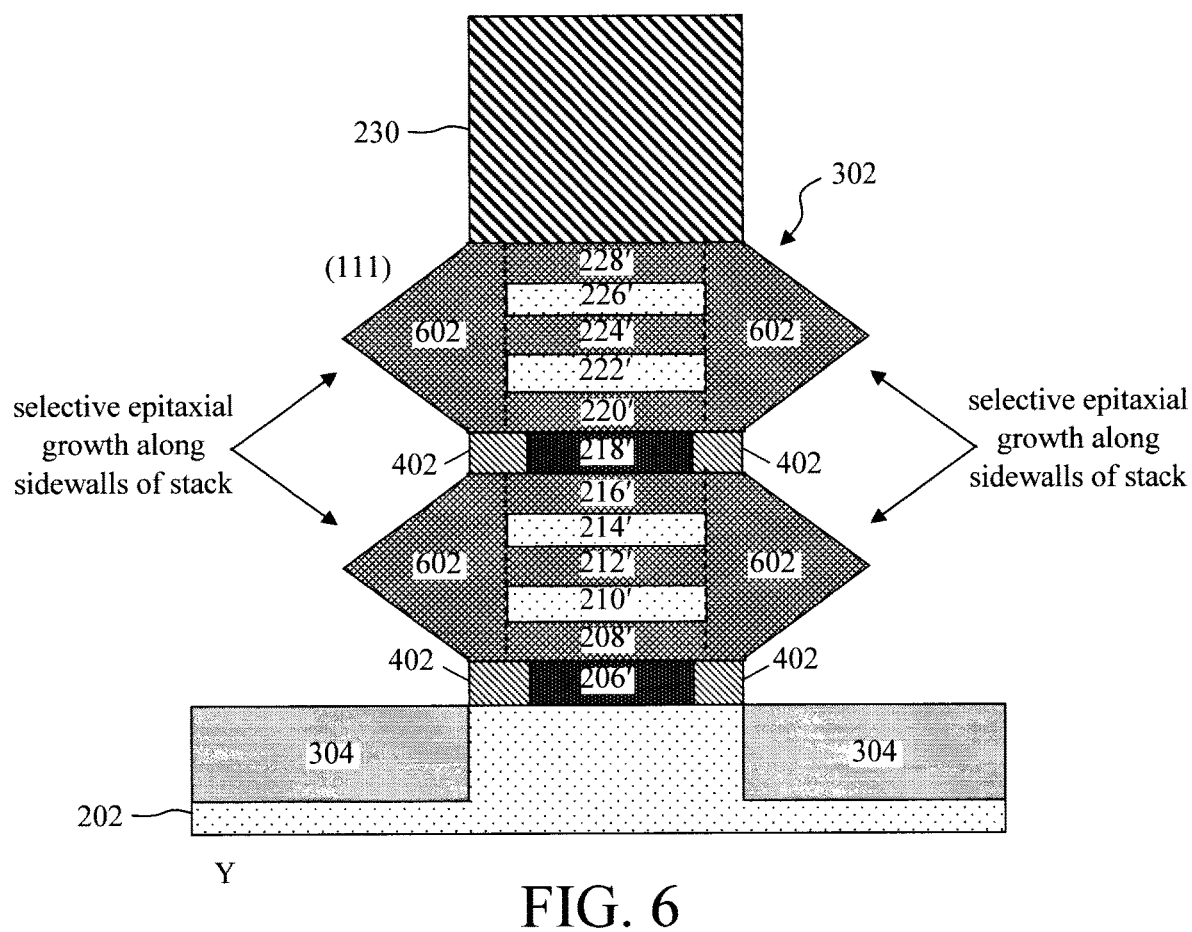
FIG. 6 is a diagram illustrating selective epitaxial growth of the first nanosheet material having been performed along the exposed sidewalls of nanosheet device stack to fully surround the second nanosheets in the first nanosheet material from a cross-sectional view perpendicular to the nanosheets according to an embodiment of the present invention.

Selective epitaxial growth of the first nanosheet material along the exposed sidewalls of nanosheet device stack 302 is then used to fully surround the lower nanosheets 210' and 214' and upper nanosheets 222' and 226' in the first nanosheet material. See epitaxial material 602 along the sidewalls of nanosheet device stack 302 in FIG. 6. FIG. 6 provides a cross-sectional view Y (see FIG. 1) through the device structure. The growth is selective in the sense that the epitaxial material 602 will deposit only on the exposed sidewall surfaces of the lower nanosheets 208'-216' and upper nanosheets 220'-228'.

As provided above, in one exemplary, non-limiting embodiment the first nanosheet material is SiGe, and the second nanosheet material is Si. In that case, the lower nanosheets 210' and 214' and upper nanosheets 222' and 226' which are formed from Si are now fully surrounded in epitaxial SiGe, i.e., lower nanosheets 208', 212', 216', and upper nanosheets 220', 224', 228' along with epitaxial material 602 (which is also SiGe). According to an exemplary embodiment, epitaxial material 602 is formed from a low Ge content SiGe (e.g., from about 20% Ge to about 50% Ge and ranges therebetween) such as SiGe30.

Figure 7:
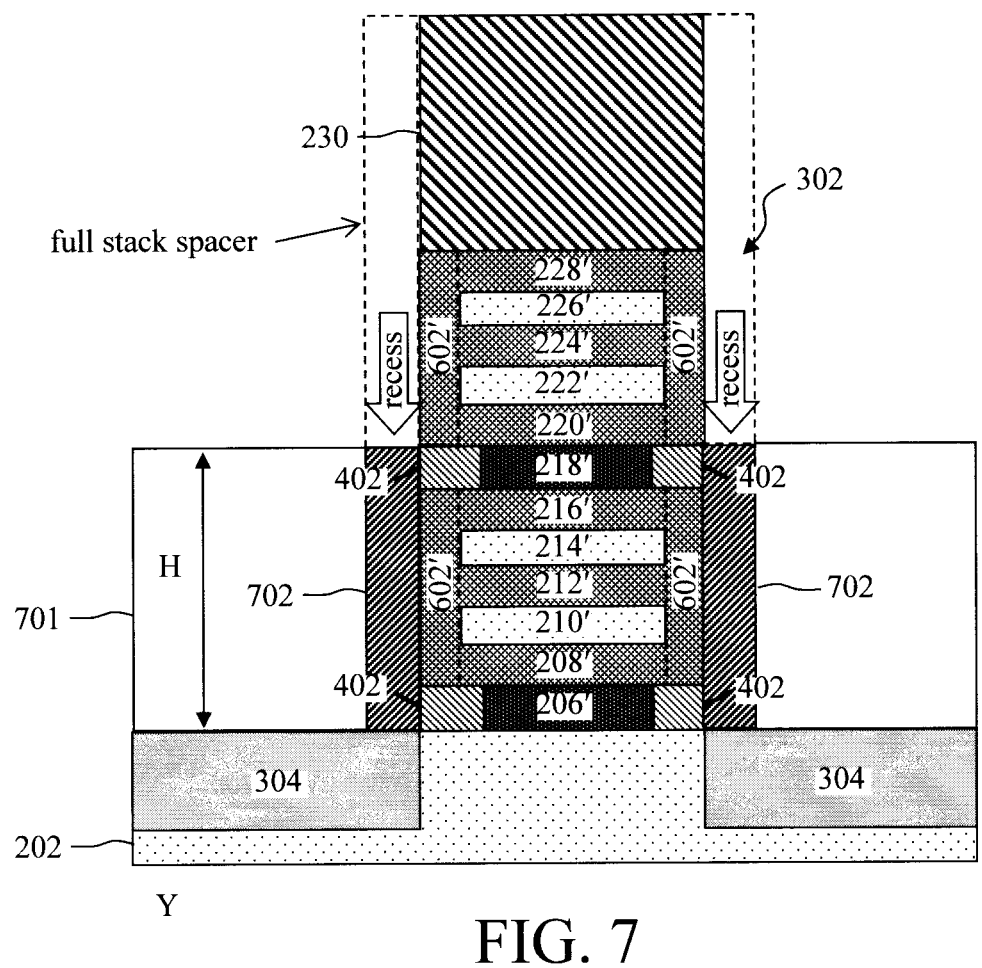
FIG. 7 is a diagram illustrating excess epitaxial material having been removed from the sidewalls of the nanosheet device stack, and first sidewall spacers having been formed alongside the sacrificial nanosheets and lower nanosheets from a cross-sectional view perpendicular to the nanosheets according to an embodiment of the present invention.

Depending on the choice of growth conditions this epitaxial material 602 can terminate with (111) surfaces making the growth self-limiting. Excess epitaxial material 602 is then removed from the sidewalls of the nanosheet device stack 302. See FIG. 7. FIG. 7 provides a cross-sectional view Y (see FIG. 1) through the device structure. This excess material can be removed using a directional (anisotropic) etching process such as reactive ion etching (RIE). The remaining epitaxial material 602 along the stack 302 sidewall is now given the reference numeral 602'.

Sidewall spacers 702 are then formed alongside the lower nanosheets 208'-216' and sacrificial nanosheets 206' and 218' of the nanosheet device stack 302. Sidewall spacers 702 may also be referred to herein as "first sidewall spacers" so as to distinguish them from the "second sidewall spacers" that will be formed alongside the upper nanosheets of the stack 302 (see below). Suitable materials for the sidewall spacers 702 include, but are not limited to, silicon carbide (SiC) and/or silicon oxycarbide (SiCO).

According to an exemplary embodiment, standard fabrication techniques are employed to form the sidewall spacers 702. For instance, as indicated by dashed lines in FIG. 7, full stack sidewall spacers are first formed alongside the nanosheet device stack 302. A planarizing material 701 such as an organic planarizing layer (OPL) material is then deposited onto substrate 202 and recessed to a height H alongside the nanosheet device stack 302. A casting process such as spin coating or spray casting can be employed to deposit the planarizing material 701 onto the substrate 202. A directional (anisotropic) etching process such as RIE can be used to recess the planarizing material 701. The full stack sidewall spacers are then recessed to the height H (e.g., using an anisotropic etching process such as RIE) to form the sidewall spacers 702 shown in FIG. 7 alongside the lower nanosheets 208'-216' and sacrificial nanosheets 206' and 218' of the nanosheet device stack 302, after which the planarizing material 701 is removed. By way of example only, an OPL planarizing material 701 can be removed using a process such as ashing.

Figure 8:
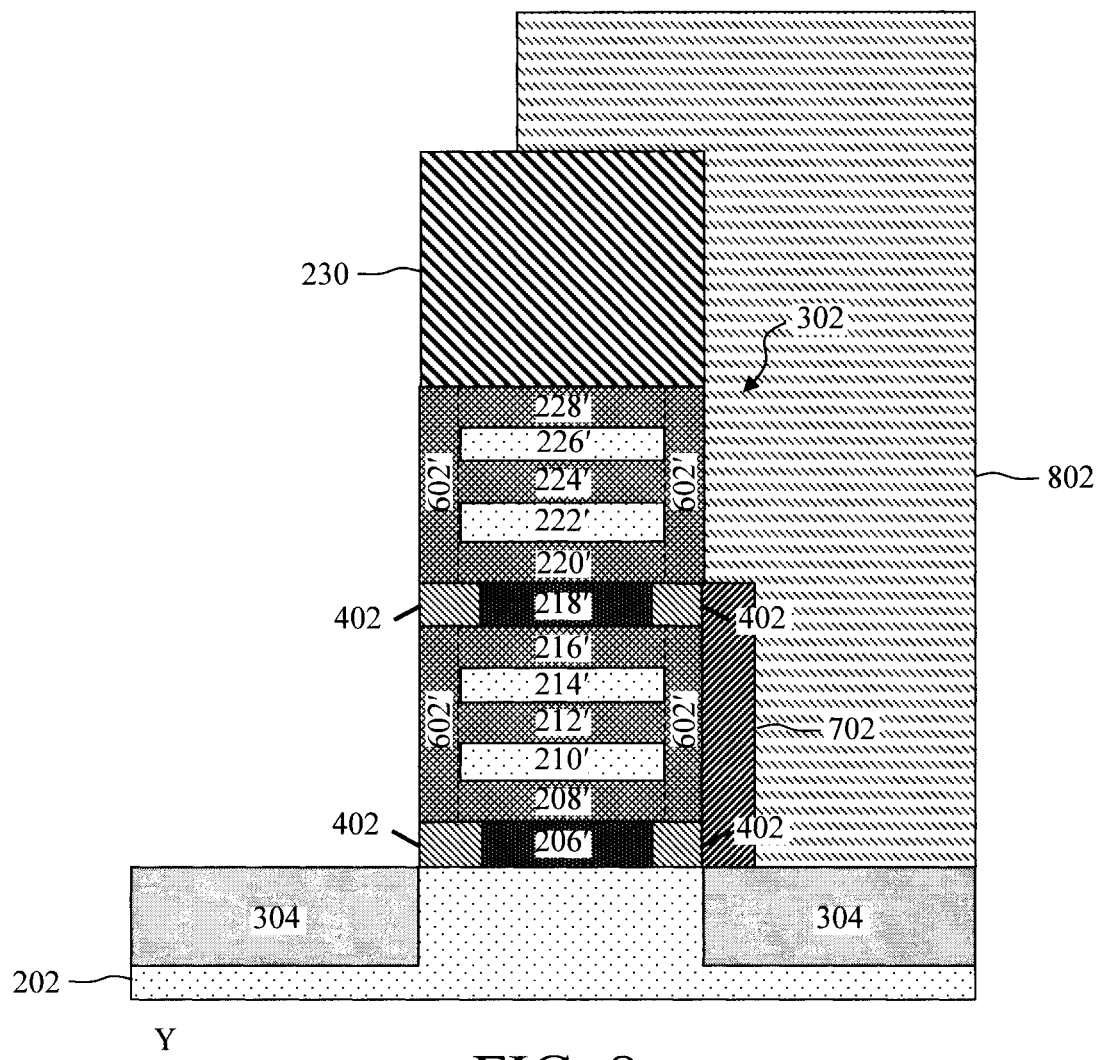
FIG. 8 is a diagram illustrating a patterned mask having been formed over a second side of the nanosheet device stack covering the first sidewall spacers alongside the second side of the nanosheet device stack, and the first sidewall spacers having been selectively removed from the first side of the nanosheet device stack from a cross-sectional view perpendicular to the nanosheets according to an embodiment of the present invention.

The sidewall spacers 702 are next selectively removed from one (first) side of the nanosheet device stack 302. As will be described in detail below, the second sidewall spacers at along the upper nanosheet device stack 302 will be selectively removed from the other (second) side of the nanosheet device stack 302, thus enabling formation of the present ζ-shaped dielectric design (see above). To selectively remove the sidewall spacers 702 from the first side of the nanosheet device stack 302, a patterned mask 802 is formed over the second side of the nanosheet device stack 302 covering the sidewall spacers 702 alongside the second side of the nanosheet device stack 302. See FIG. 8. FIG. 8 provides a cross-sectional view Y (see FIG. 1) through the device structure. It is notable that the depiction in the figures of the first and second sides corresponding to the left and right sides of the nanosheet device stack 302 is completely arbitrary. All that is important is the first and second sides of the nanosheet device stack 302 are opposite one another along the stack sidewall. Suitable materials for mask 802 include, but are not limited to, an OPL material. Standard lithography and etching techniques can be employed to pattern the mask 802. For instance, a lithographic stack (not shown), e.g., photoresist and anti-reflective coating (ARC), is used to pattern mask 802.

With mask 802 covering the sidewall spacers 702 along the second side of the nanosheet device stack 302, the sidewall spacers 702 are then selectively removed from the first side of the nanosheet device stack 302. According to an exemplary embodiment, the sidewall spacers 702 are selectively removed from the first side of the nanosheet device stack 302 using a non-directional (isotropic) etching process such as a wet chemical etch. Mask 802 is then also removed. By way of example only, an OPL mask 802 can be removed using a process such as ashing. What remains is the sidewall spacer 702 along the second side of the nanosheet device stack 302.

Figure 9:
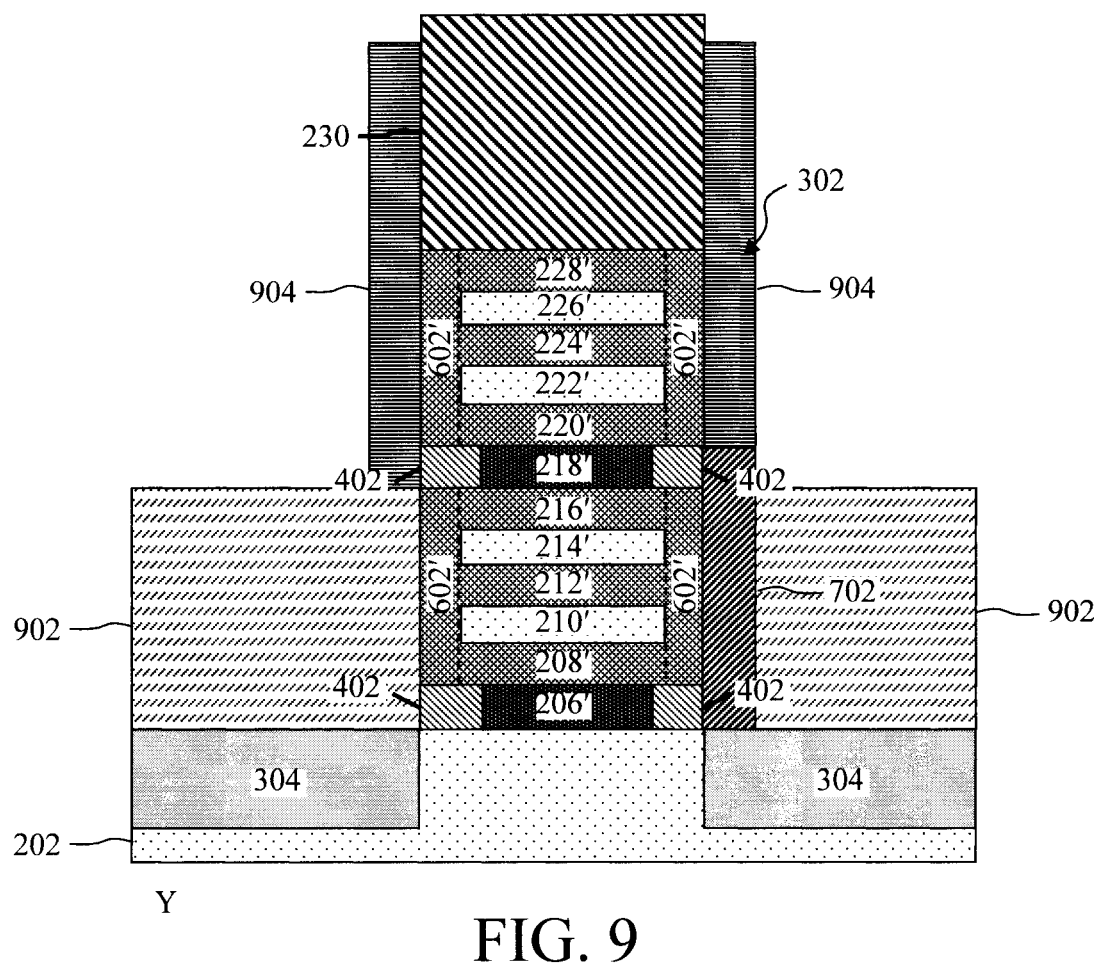
FIG. 9 is a diagram illustrating a patterned mask having been formed covering the first sidewall spacers along the second side of the nanosheet device stack, and second sidewall spacers having been formed alongside the upper nanosheet device stack and hardmask from a cross-sectional view perpendicular to the nanosheets according to an embodiment of the present invention.

The process is then repeated to form the second sidewall spacers along the upper sidewalls of the nanosheet device stack 302, followed by their selective removal from the other (second) side of the nanosheet device stack 302. First however, a patterned mask 902 is formed masking/covering the sidewall spacers 702 along the second side of the nanosheet device stack 302. See FIG. 9. FIG. 9 provides a cross-sectional view Y (see FIG. 1) through the device structure. Suitable materials for mask 902 include, but are not limited to, an OPL material. Standard lithography and etching techniques (see above) can be employed to pattern the mask 902.

With mask 902 covering the sidewall spacers 702 along the second side of the nanosheet device stack 302, (second) sidewall spacers 904 are then formed alongside the upper nanosheet device stack 302 and hardmask 230. It is notable that, as will be described in detail below, sidewall spacers 904 will eventually be removed in their entirety and a portion of the sidewall spacers 904 will be replaced with the (ζ-shaped) dielectric spacer. Suitable materials for the sidewall spacers 904 include, but are not limited to, metal oxides such as titanium oxide (TiO) and/or tantalum oxide (TaO) and/or high Ge content SiGe (SiGe having a Ge content of from about 50% Ge to about 100% Ge and ranges therebetween such as SiGe60). As provided above, etchants such as dry HCl are selective for high Ge content SiGe. As shown in FIG. 9, on the first/left side of the nanosheet device stack 302, sidewall spacers 904 are present along the stack sidewall above the mask 902. On the second/right side of the nanosheet device stack 302, sidewall spacers 904 are present along the stack sidewall above the (remaining) sidewall spacer 702. Mask 902 is then removed. By way of example only, an OPL mask 902 can be removed using a process such as ashing.

Figure 10:
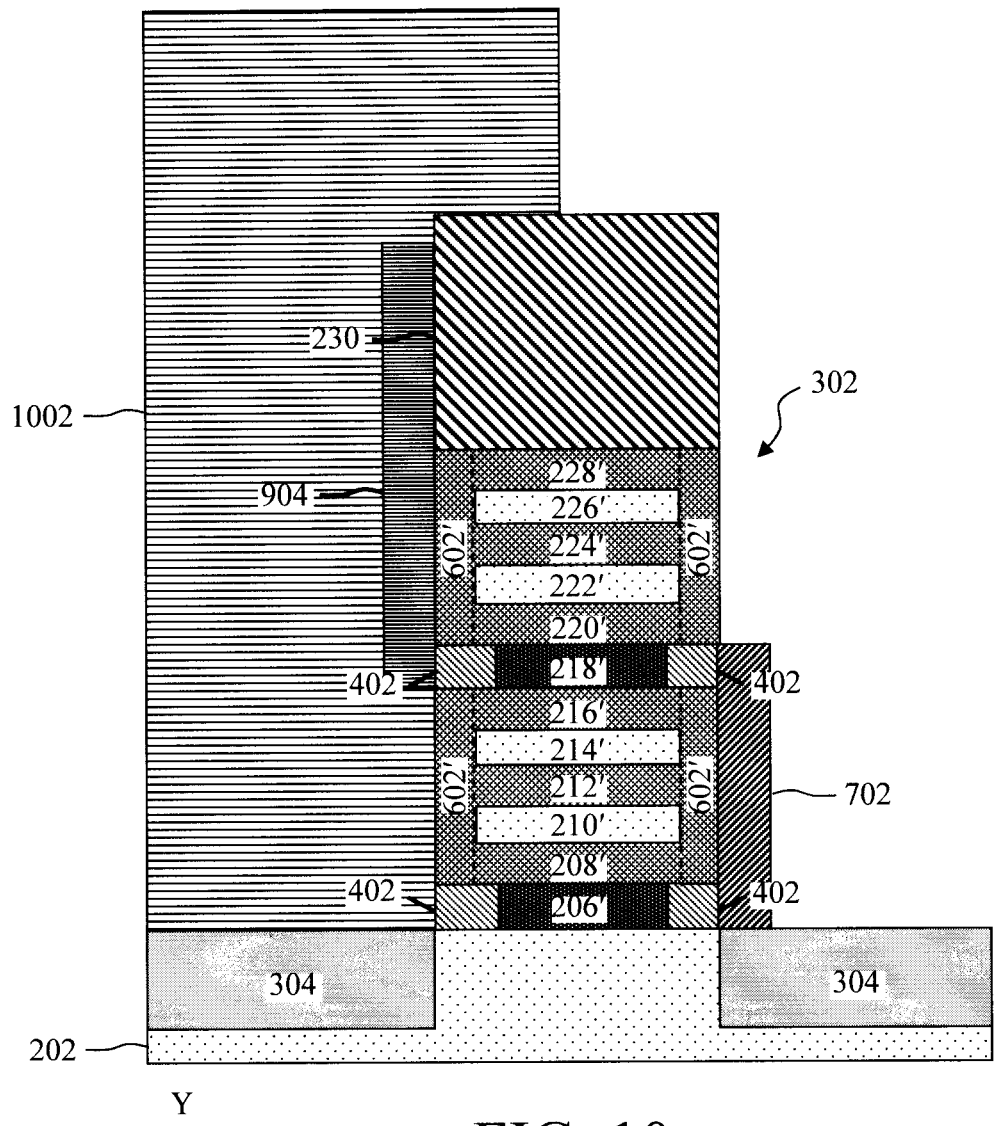
FIG. 10 is a diagram illustrating a patterned mask having been formed over the first side of the nanosheet device stack covering the second sidewall spacers 904 alongside the first side of the nanosheet device stack, and the second sidewall spacers having been selectively removed from the second side of the nanosheet device stack from a cross-sectional view perpendicular to the nanosheets according to an embodiment of the present invention.

The sidewall spacers 904 are then selectively removed from the second side of the nanosheet device stack 302. To do so, a patterned mask 1002 is formed over the first side of the nanosheet device stack 302 covering the sidewall spacers 904 alongside the first side of the nanosheet device stack 302. See FIG. 10. FIG. 10 provides a cross-sectional view Y (see FIG. 1) through the device structure. As provided above, suitable materials for mask 1002 include, but are not limited to, an OPL material. Standard lithography and etching techniques (see above) can be employed to pattern the mask 1002.

With mask 1002 covering the sidewall spacers 904 along the first side of the nanosheet device stack 302, the sidewall spacers 904 are then selectively removed from the second side of the nanosheet device stack 302. According to an exemplary embodiment, the sidewall spacers 904 are selectively removed from the second side of the nanosheet device stack 302 using a non-directional (isotropic) etching process such as a wet chemical etch. Mask 1002 is then also removed. By way of example only, an OPL mask 1002 can be removed using a process such as ashing. What remains is the sidewall spacer 904 along the first side of the nanosheet device stack 302. The hardmask 230 is also removed from the top of the nanosheet device stack 302. As provided above, hardmask 230 can be formed from a nitride material (e.g., SiN, SiON and/or SiCN) and/or an oxide material (e.g., SiOx). In that case, a nitride- and/or oxide-selective etching process can be employed to remove hardmask 230.

Figure 11:
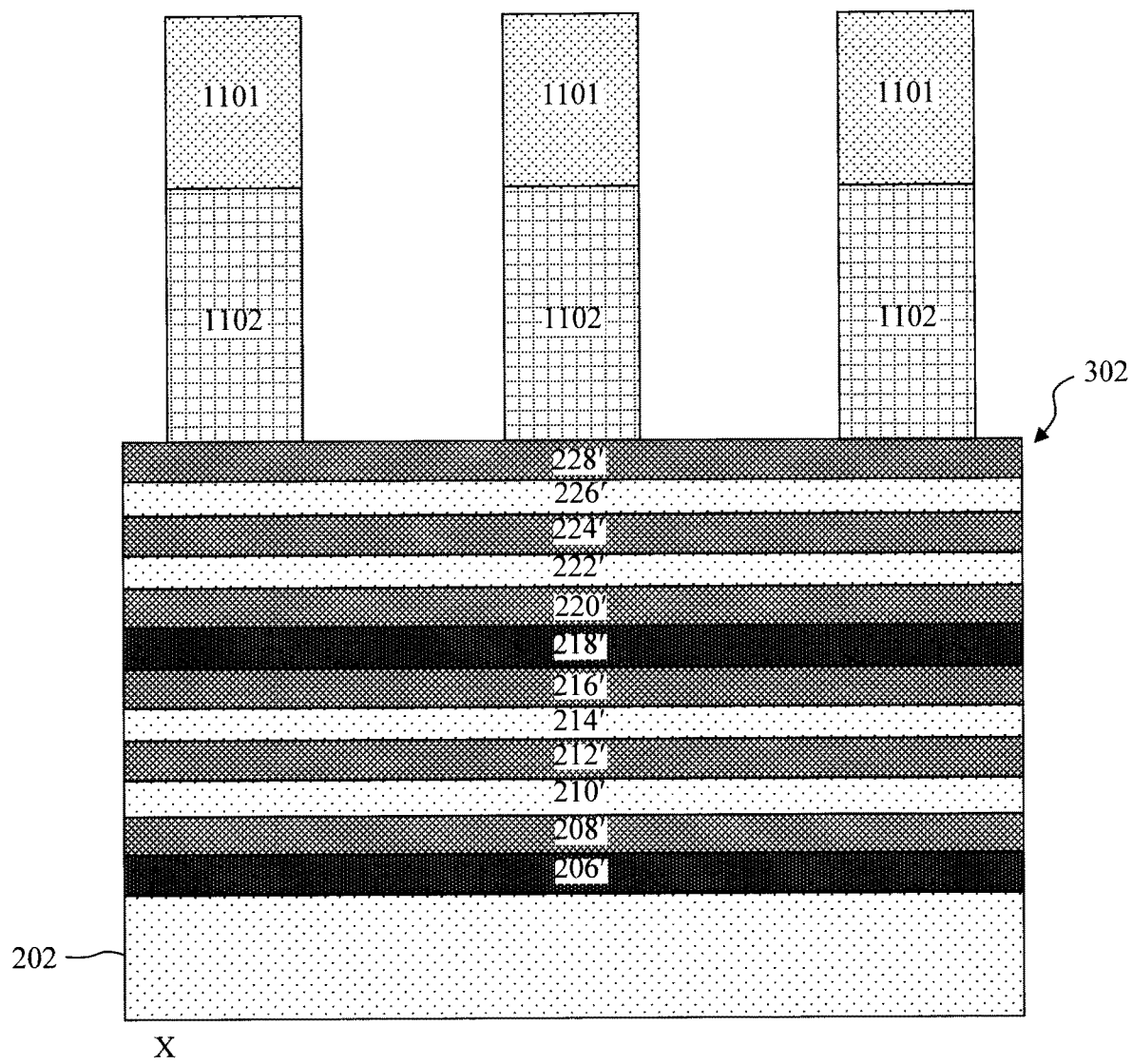
FIG. 11 is a diagram illustrating sacrificial gates and sacrificial gate hardmasks having been formed on the nanosheet device stack over channel regions of the CFET device from a cross-sectional view parallel to the nanosheets according to an embodiment of the present invention.

Sacrificial gates 1102 are then formed on the nanosheet device stack 302 over channel regions of the CFET device. See FIG. 11. FIG. 11 provides a cross-sectional view X (see FIG. 1) through the device structure. To form sacrificial gates 1102, a sacrificial gate material is first blanket deposited over the nanosheet device stack 302. Suitable sacrificial gate materials include, but are not limited to, ploy-silicon (poly-Si) and/or amorphous silicon (a-Si). A process such as CVD, ALD or PVD can be employed to deposit the sacrificial gate material over the nanosheet device stack 302.

Sacrificial gate hardmasks 1101 are then formed on the sacrificial gate material marking the footprint and location of each of the sacrificial gates 1102. Suitable materials for the sacrificial gate hardmasks 1101 include, but are not limited to, nitride hardmask materials such as SiN, SiON and/or SiCN, and/or oxide hardmask materials such as SiOx. An etch using the sacrificial gate hardmasks 1101 is then used to pattern the sacrificial gate material into the individual sacrificial gates 1102 shown in FIG. 11. A directional (anisotropic) etching process such as RIE can be employed for the sacrificial gate etch.

Figure 12:
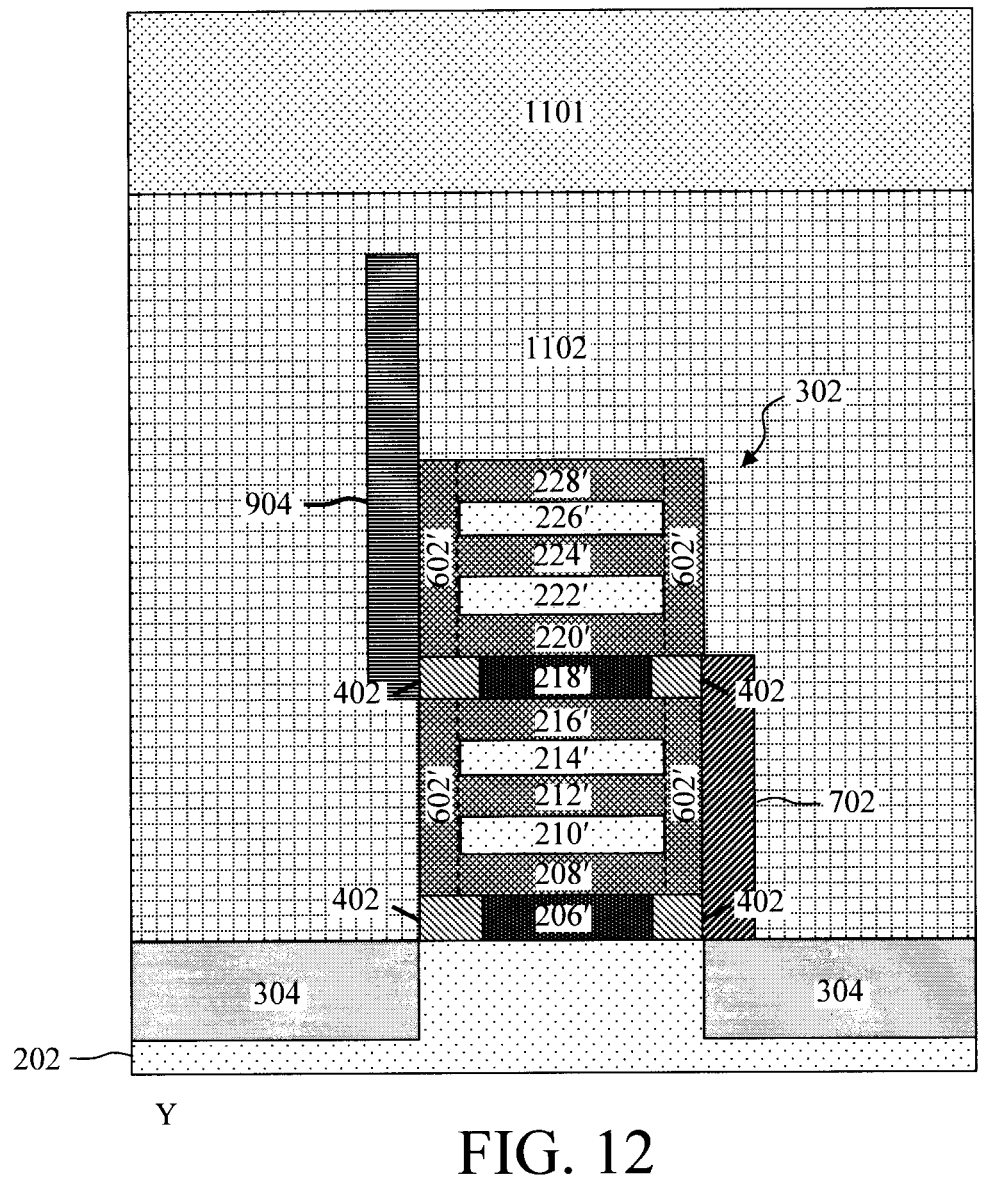
FIG. 12 is a diagram illustrating the sacrificial gates and sacrificial gate hardmasks having been formed on the nanosheet device stack from a cross-sectional view perpendicular to the nanosheets according to an embodiment of the present invention.

One of the sacrificial gates 1102 having been formed on the nanosheet device stack 302 is also depicted in FIG. 12. FIG. 12 provides a cross-sectional view Y (see FIG. 1) through the device structure. As shown in FIG. 12, the sacrificial gates 1102 surround the nanosheet device stack 302, the (first) sidewall spacer 702 along the lower second/right sidewall of the nanosheet device stack 302, and the (second) sidewall spacer 904 along the upper first/left sidewall of the nanosheet device stack 302.

Figure 13:
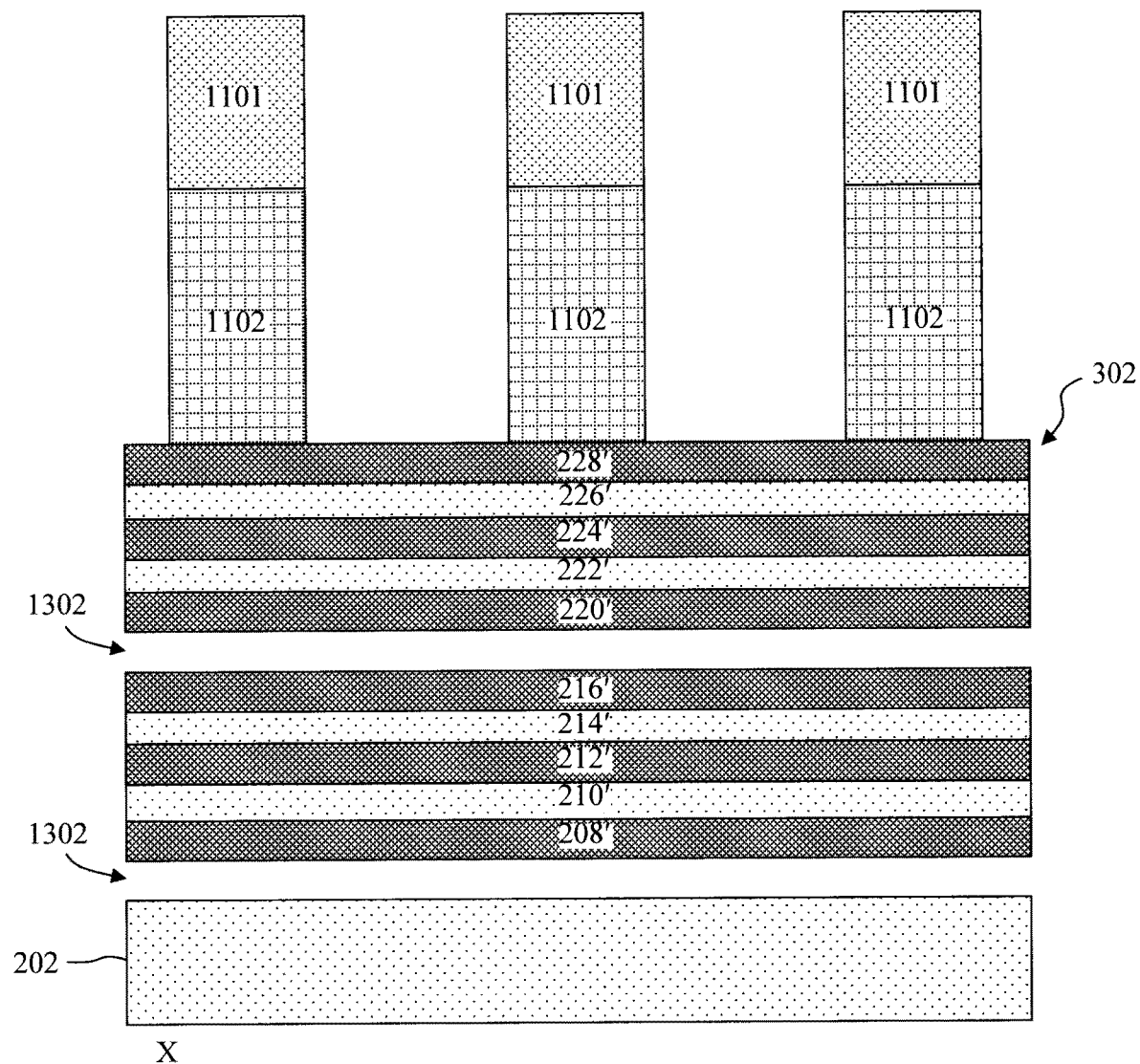
FIG. 13 is a diagram illustrating the sacrificial nanosheets having been selectively removed forming openings in the nanosheet device stack from a cross-sectional view parallel to the nanosheets according to an embodiment of the present invention.
Figure 14:
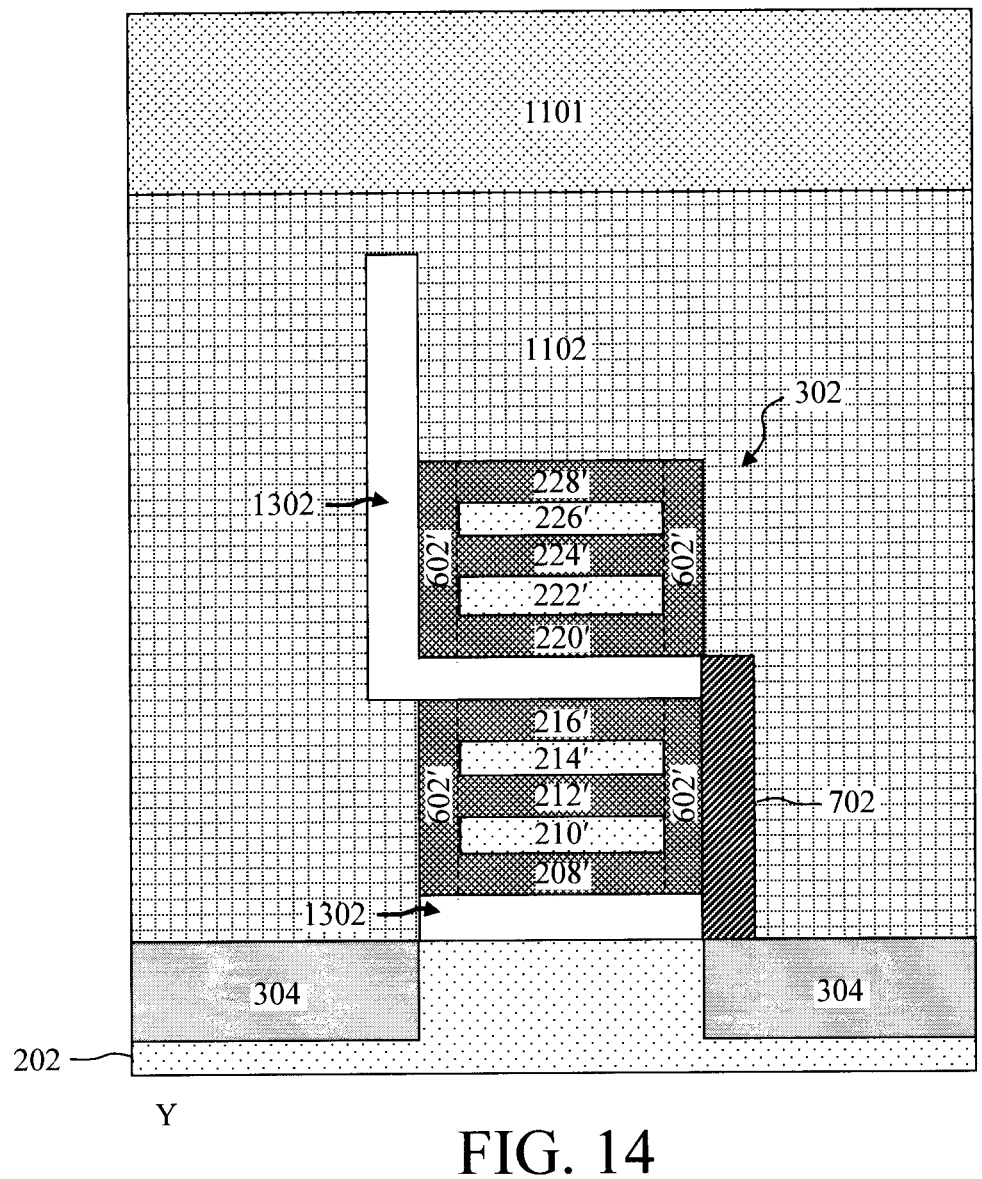
FIG. 14 is a diagram illustrating the sacrificial nanosheets as well as the second sidewall spacer and sacrificial spacers having been selectively removed forming the openings in the nanosheet device stack and sacrificial gates from a cross-sectional view perpendicular to the nanosheets according to an embodiment of the present invention.

The sacrificial nanosheets 218' and 206' (see FIG. 13) as well as the (second) sidewall spacer 904 and sacrificial spacers 402 (see FIG. 14) are then selectively removed forming openings 1302 in the nanosheet device stack 302 and sacrificial gates 1102. FIG. 13 provides a cross-sectional view X (see FIG. 1) through the device structure. FIG. 14 provides a cross-sectional view Y (see FIG. 1) through the device structure. According to an exemplary embodiment, a non-directional (isotropic) etching process (or combination of etching processes) can be employed to remove the sacrificial nanosheets 218' and 206', sidewall spacer 904 and sacrificial spacers 402. For instance, as provided above, sacrificial spacers 402 and sidewall spacer 904 can be formed from metal oxides such as TiO and/or TaO which can be removed using a metal oxide-selective etchant. Alternatively, as provided above, sidewall spacers 904 and sacrificial nanosheets 218' and 206' formed from a high Ge content SiGe can be selectively removed using an etchant such as dry HCl.

Figure 15:
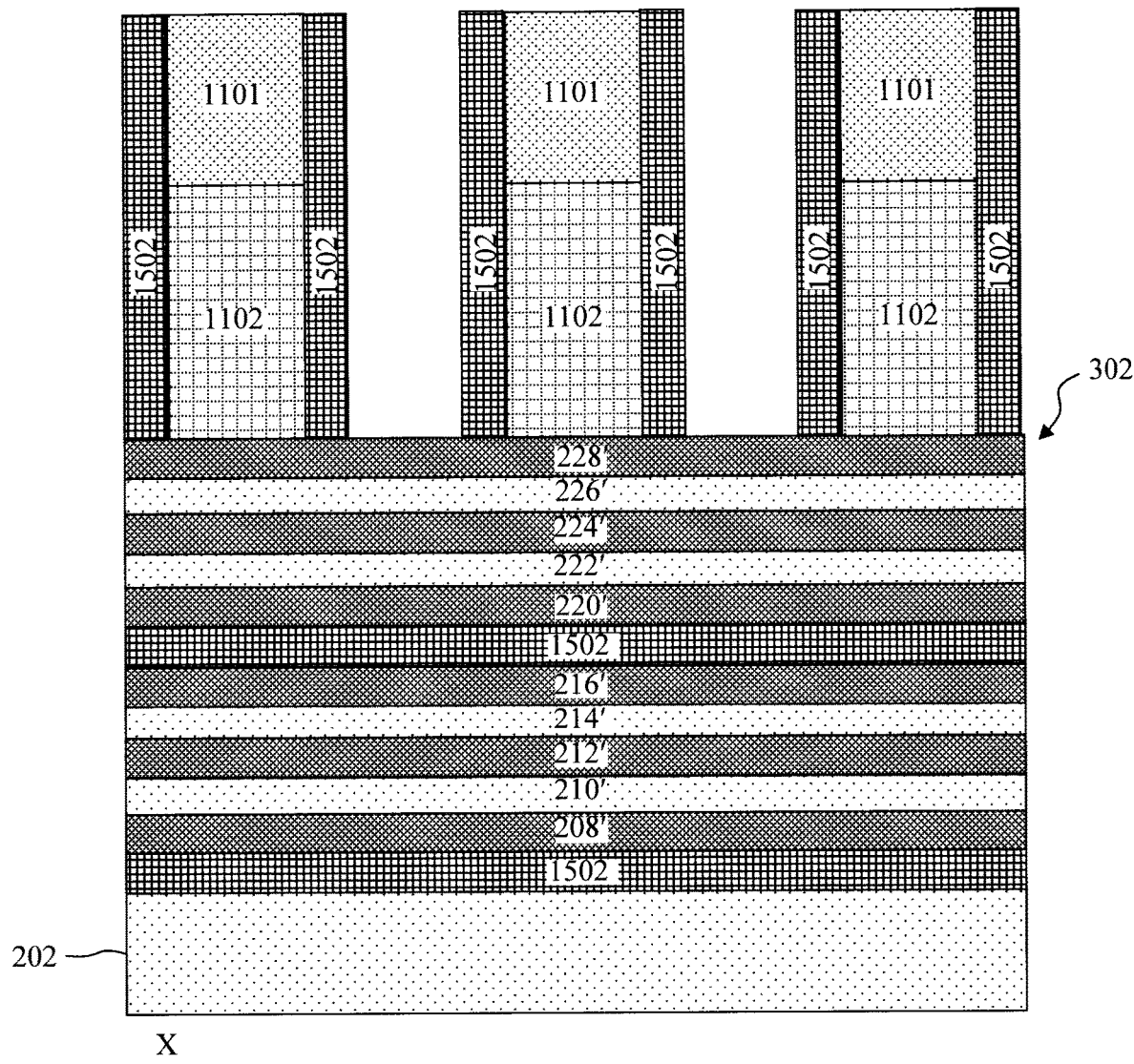
FIG. 15 is a diagram illustrating dielectric spacers having been formed alongside the sacrificial gate hardmasks and sacrificial gates, and within the openings from a cross-sectional view parallel to the nanosheets according to an embodiment of the present invention.
Figure 16:
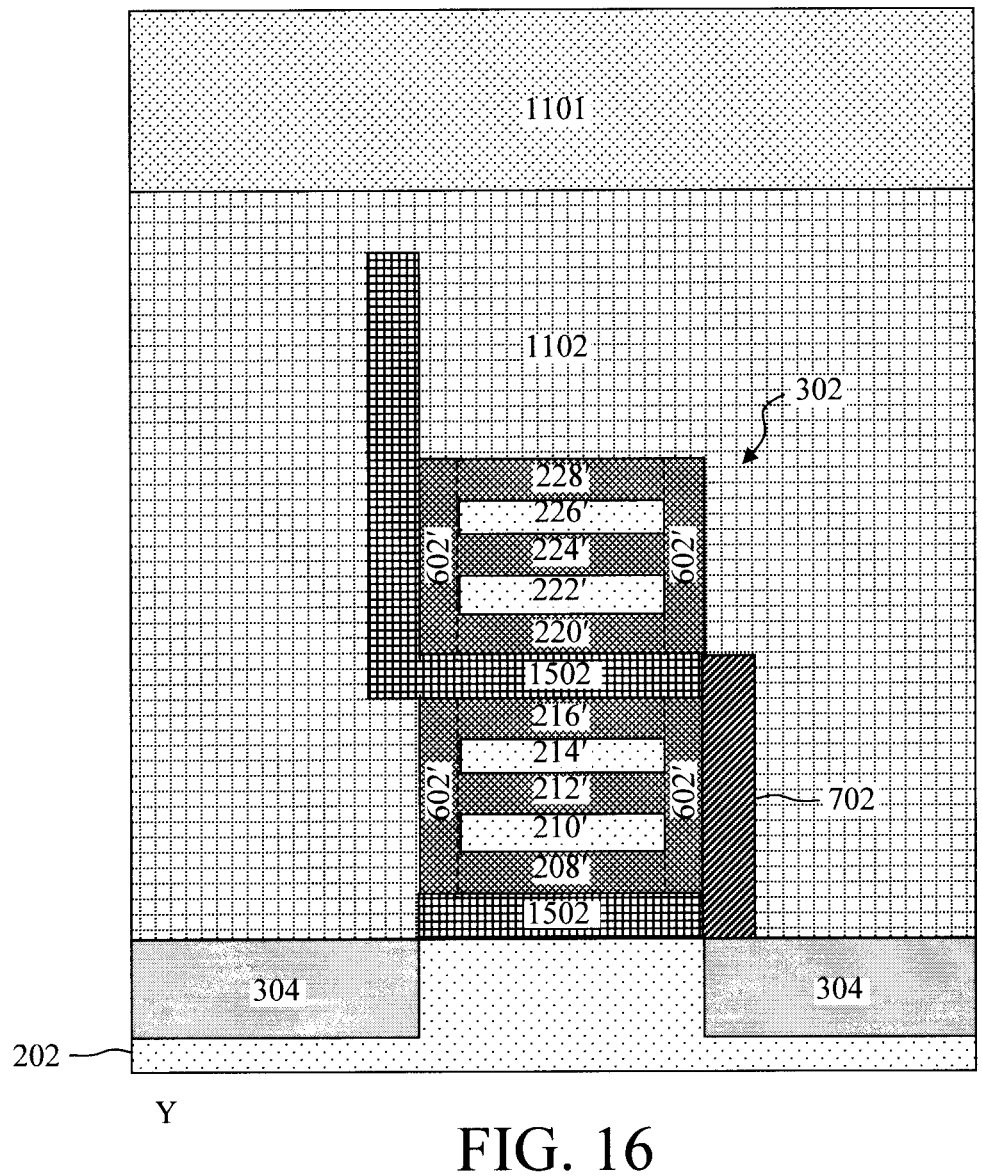
FIG. 16 is a diagram illustrating the dielectric spacers having been formed within the openings from a cross-sectional view perpendicular to the nanosheets according to an embodiment of the present invention.

Dielectric spacers 1502 are then formed alongside the sacrificial gate hardmasks 1101 and sacrificial gates 1102 and within the openings 1302. See FIGS. 15 and 16. FIG. 15 provides a cross-sectional view X (see FIG. 1) through the device structure. FIG. 16 provides a cross-sectional view Y (see FIG. 1) through the device structure. Suitable materials for dielectric spacers 1502 include, but are not limited to, SiOx, SiC and/or SiCO. A process such as CVD, ALD or PVD can be employed to deposit the dielectric spacers 1502 alongside the sacrificial gate hardmasks 1101/sacrificial gates 1102 which will also fill the openings 1302.

Sacrificial gates 1102 serve as a placeholder for the final gates of the CFET device. Namely, sacrificial gates 1102 will be removed later on in the process and replaced with metal gate stacks that will serve as the final gates of the CFET device. Thus, these final gates of the CFET device are also referred to herein as "replacement metal gates" or simply "RMG." Use of an RMG process is advantageous because it prevents exposure of the metal gate stack materials to potentially damaging conditions during subsequent processing steps. For instance, the high-κ dielectrics used in the RMG gate stacks can be damaged by exposure to high temperatures. Thus, these gate stack materials are only placed near the end of the process.

Figure 17:
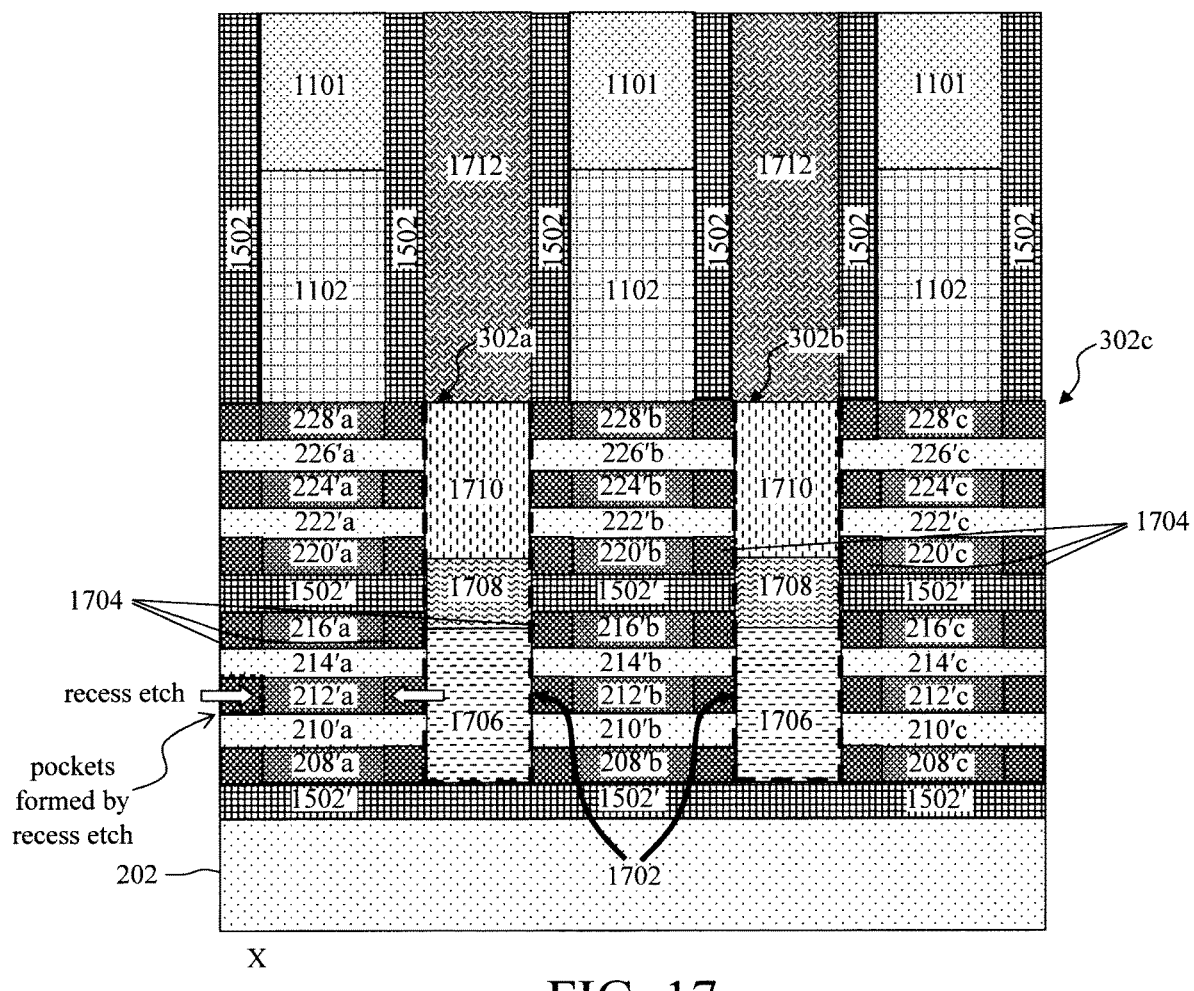
FIG. 17 is a diagram illustrating trenches having been patterned in the nanosheet device stack in between the sacrificial gates forming individual CFET stacks, the first nanosheets having been selectively recessed to form pockets along the sidewalls of the CFET stacks, inner spacers having been formed within the pockets, lower source and drains having been formed on opposite sides of the lower nanosheets, upper source and drains having been formed on opposite sides of the upper nanosheets, separated from the lower source and drains by an isolation spacer, and the sacrificial gates having been surrounded in an interlayer dielectric (ILD) from a cross-sectional view parallel to the nanosheets according to an embodiment of the present invention.

Next, sacrificial gates 1102 and dielectric spacers 1502 are next used as a mask to pattern trenches 1702 (outlined with dashed lines) in nanosheet device stack 302 in between the sacrificial gates 1102. See FIG. 17. FIG. 17 provides a cross-sectional view X (see FIG. 1) through the device structure. A directional (anisotropic) etching process such as RIE can be employed for the trench etch. As shown in FIG. 17, this etch patterns nanosheet device stack 302 into multiple individual CFET stacks 302*a,b,c*, etc. The patterned portions of the lower nanosheets 208'-216' and upper nanosheets 220'-228' are now also designated as a, b, c, etc. The patterned dielectric spacers 1502 are now designated as 1502'.

Lower and upper source and drains are then formed in the trenches 1702 on opposite sides of the lower nanosheets 208'*a,b,c*, etc.-216'*a,b,c*, etc. and upper nanosheets 220'*a,b,c*, etc.-228'*a,b,c*, etc. First, however, inner spacers 1704 are formed alongside the lower nanosheets 208'*a,b,c*, etc., 212'*a,b,c*, etc., and 216'*a,b,c*, etc. and upper nanosheets 220'*a,b,c*, etc., 224'*a,b,c*, etc., and 228'*a,b,c*, etc. in each of the CFET stacks 302*a,b,c*, etc. To do so, a selective etch is performed to recess the lower nanosheets 208'*a,b,c*, etc., 212'*a,b,c*, etc., and 216'*a,b,c*, etc. and upper nanosheets 220'*a,b,c*, etc., 224'*a,b,c*, etc., and 228'*a,b,c*, etc. exposed along the sidewalls of the CFET stacks 302*a,b,c*, etc. See FIG. 17. This recess etch forms pockets along the sidewalls of the CFET stacks 302*a,b,c*, etc. that are then filled with a spacer material to form inner spacers 1704 within the pockets. These inner spacers 1704 will offset the replacement metal gates from the source and drains (see below). As provided above, according to an exemplary embodiment, the lower nanosheets 208'*a,b,c*, etc., 212'*a,b,c*, etc., and 216'*a,b,c*, etc. and upper nanosheets 220'*a,b,c*, etc., 224'*a,b,c*, etc., and 228'*a,b,c*, etc. are formed from SiGe. In that case, a SiGe-selective non-directional (isotropic) etching process can be used for the recess etch. Suitable spacer materials for inner spacers 1704 include, but are not limited to, silicon nitride (SiN), SiOx, SiC and/or SiCO. A process such as CVD, ALD or PVD can be employed to deposit the spacer material into the pockets. Excess spacer material is removed from the trenches 1702 using a directional (anisotropic) etching process such as RIE.

Lower source and drains 1706 and upper source and drains 1710 are then formed in the trenches 1702 on opposite sides of the lower nanosheets 208'*a,b,c*, etc.-216'*a,b,c*, etc. and upper nanosheets 220'*a,b,c*, etc.-228'*a,b,c*, etc., respectively. As shown in FIG. 17, an isolation spacer 1708 is formed in trenches 1702 on lower source and drains 1706. Isolation spacer 1708 separates the lower source and drains 1706 from the upper source and drains 1710. Lower source and drains 1706, isolation spacer 1708, and upper source and drains 1710 are formed by depositing the respective source and drain or isolation spacer material into trenches 1702 followed by a recess etch of the material to the proper depth alongside the CFET stacks 302*a,b,c*, etc. See, for example, U.S. Pat. No. 10,418,449 issued to Paul et al., entitled "Circuits Based on Complementary Field-Effect Transistors," the contents of which are incorporated by reference as if fully set forth herein.

According to an exemplary embodiment, lower source and drains 1706 and upper source and drains 1710 are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 1704 in place along the CFET stacks 302*a,b,c*, etc. sidewall, epitaxial growth of the lower source and drains 1706 and upper source and drains 1710 is templated from the (exposed) ends of lower nanosheets 210'*a,b,c*, etc. and 214'*a,b,c*, etc. and upper nanosheets 222'*a,b,c*, etc. and 226'*a,b,c*, etc., respectively. As provided above, the lower nanosheets will form a device of a first polarity, i.e., a PFET or an NFET, and the upper nanosheets in the stack will form a device of a second/opposite polarity, i.e., an NFET if the lower device is a PFET, or vice versa. For instance, in one exemplary, non-limiting embodiment the lower nanosheets form a PFET whereby the lower source and drains 1706 contain a p-type dopant, and the upper nanosheets form an NFET whereby the upper source and drains 1710 contain an n-type dopant.

Namely, according to an exemplary embodiment, a first (n- or p-type) doped epitaxial material is grown in trenches 1702 on opposite sides of the CFET stacks 302*a,b,c*, etc. and then recessed to form the lower source and drains 1706. As shown in FIG. 17, inner spacers 1704 separate lower source and drains 1706 from the lower nanosheets 208'*a,b,c*, etc., 212'*a,b,c*, etc., and 216'*a,b,c*, etc. A directional (anisotropic) etching process such as RIE can be used to recess the lower source and drains 1706.

A spacer material is then deposited into the trenches 1702 over the lower source and drains 1706 and then recessed to form the isolation spacer 1708. Suitable materials for isolation spacer 1708 include, but are not limited to, SiN, SiOx, SiC and/or SiCO. A process such as CVD, ALD or PVD can be employed to deposit the spacer material.

A second (n- or p-type) doped epitaxial material of opposite polarity from the lower source and drains 1706 is grown in trenches 1702 on opposite sides of the CFET stacks 302a,b,c, etc. over isolation spacer 1708 and then recessed to form the upper source and drains 1710. As shown in FIG. 17, inner spacers 1704 separate upper source and drains 1710 from the upper nanosheets 220'a,b,c, etc., 224'a,b,c, etc., and 228'a,b,c, etc. A directional (anisotropic) etching process such as RIE can be used to recess the upper source and drains 1710.

Following formation of the lower source and drains 1706 and upper source and drains 1710, the sacrificial gates 1102 are selectively removed. To do so, the sacrificial gates 1102 are first surrounded in an interlayer dielectric (ILD) 1712. Suitable ILD materials include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 1712 around the sacrificial gates 1102. Following deposition, ILD 1712 can be planarized using a process such as chemical mechanical polishing (CMP).

Figure 18:
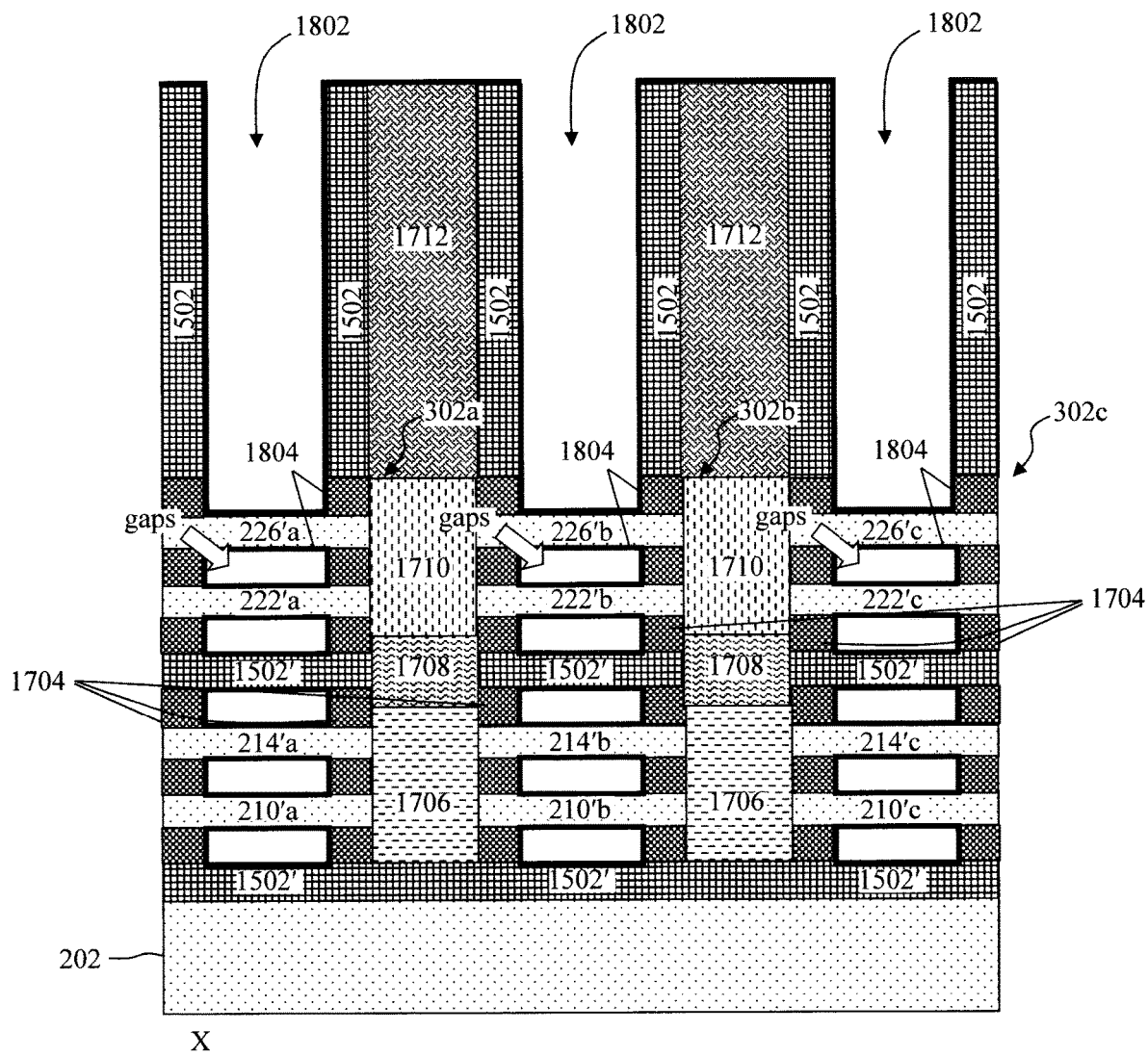
FIG. 18 is a diagram illustrating the sacrificial gates having been selectively removed forming gate trenches in the ILD over the CFET stacks, the first nanosheets having been selectively removed forming gaps in the lower nanosheets and the upper nanosheets, and a conformal gate dielectric having been deposited into and lining each of the gate trenches and gaps from a cross-sectional view parallel to the nanosheets according to an embodiment of the present invention.

Sacrificial gates 1102 are then selectively removed forming gate trenches 1802 in the ILD 1712 over the CFET stacks 302a,b,c, etc. See FIG. 18. FIG. 18 provides a cross-sectional view X (see FIG. 1) through the device structure. The lower nanosheets 208'a,b,c, etc., 212'a,b,c, etc., and 216'a,b,c, etc. and upper nanosheets 220'a,b,c, etc., 224'a,b,c, etc., and 228'a,b,c, etc., now accessible through gate trenches 1802, are then selectively removed. Removal of these nanosheets releases the lower nanosheets 210'a,b,c, etc. and 214'a,b,c, etc., and upper nanosheets 222'a,b,c, etc. and 226'a,b,c, etc. from the CFET stacks 302a,b,c, etc. in the channel region of the device. Namely, gaps are now present in the CFET stacks 302a,b,c, etc. in between the lower nanosheets 210'a,b,c, etc. and 214'a,b,c, etc., and upper nanosheets 222'a,b,c, etc. and 226'a,b,c, etc. in the channel region of the device. In this example, lower nanosheets 210'a,b,c, etc. and 214'a,b,c, etc., and upper nanosheets 222'a,b,c, etc. and 226'a,b,c, etc. will be used to form the nanosheet channels of the CFET device. The gate trenches 1802 and the gaps in the CFET stacks 302a,b,c, etc. enable replacement metal gates (RMGs), i.e., including a gate dielectric and at least one workfunction-setting metal, to be formed that fully surround a portion of each of the nanosheet channels in a gate-all-around configuration.

Namely, as shown in FIG. 18, a conformal gate dielectric 1804 is next deposited into and lining each of the gate trenches 1802 and gaps in the channel region of the device. According to an exemplary embodiment, gate dielectric 1804 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit gate dielectric 1804. According to an exemplary embodiment, gate dielectric 1804 has a thickness of from about 1 nanometer (nm) to about 5 nm and ranges therebetween. A reliability anneal can be performed following deposition of gate dielectric 1804. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

Figure 19:
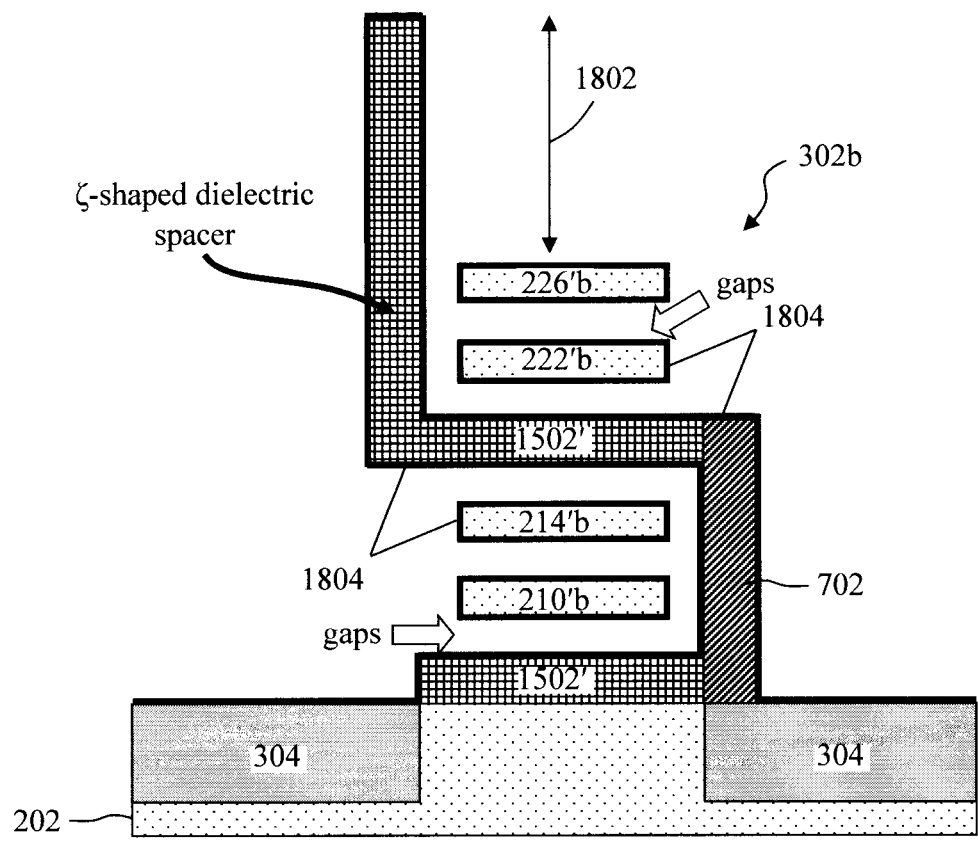
FIG. 19 is a diagram illustrating the sacrificial gates having been selectively removed forming gate trenches in the ILD over the CFET stacks, the first nanosheets having been selectively removed forming gaps in the lower nanosheets and the upper nanosheets, and a conformal gate dielectric having been deposited into and lining each of the gate trenches and gaps from a cross-sectional view perpendicular to the nanosheets according to an embodiment of the present invention.

The removal of the sacrificial gates 1102, the lower nanosheets 208'a,b,c, etc., 212'a,b,c, etc., and 216'a,b,c, etc. and upper nanosheets 220'a,b,c, etc., 224'a,b,c, etc., and 228'a,b,c, etc., is also illustrated in FIG. 19. FIG. 19 provides a cross-sectional view Y (see FIG. 1) through the device structure. As provided above, this process forms gaps in the CFET stacks 302a,b,c, etc. in between the lower nanosheets 210'a,b,c, etc. and 214'a,b,c, etc., and upper nanosheets 222'a,b,c, etc. and 226'a,b,c, etc. in the channel region of the device. As shown in FIG. 19, these gaps are then lined with conformal gate dielectric 1804, followed by a reliability anneal. FIG. 19 further illustrates how the dielectric spacers 1502' and (first) sidewall spacer 702 form the present ζ-shaped dielectric spacer separating the lower nanosheets 210'a,b,c, etc. and 214'a,b,c, etc. from the upper nanosheets 222'a,b,c, etc. and 226'a,b,c, etc. which will be used to form devices of a first and second/opposite polarity (e.g., a PFET and NFET, or vice versa), respectively.

Figure 20:
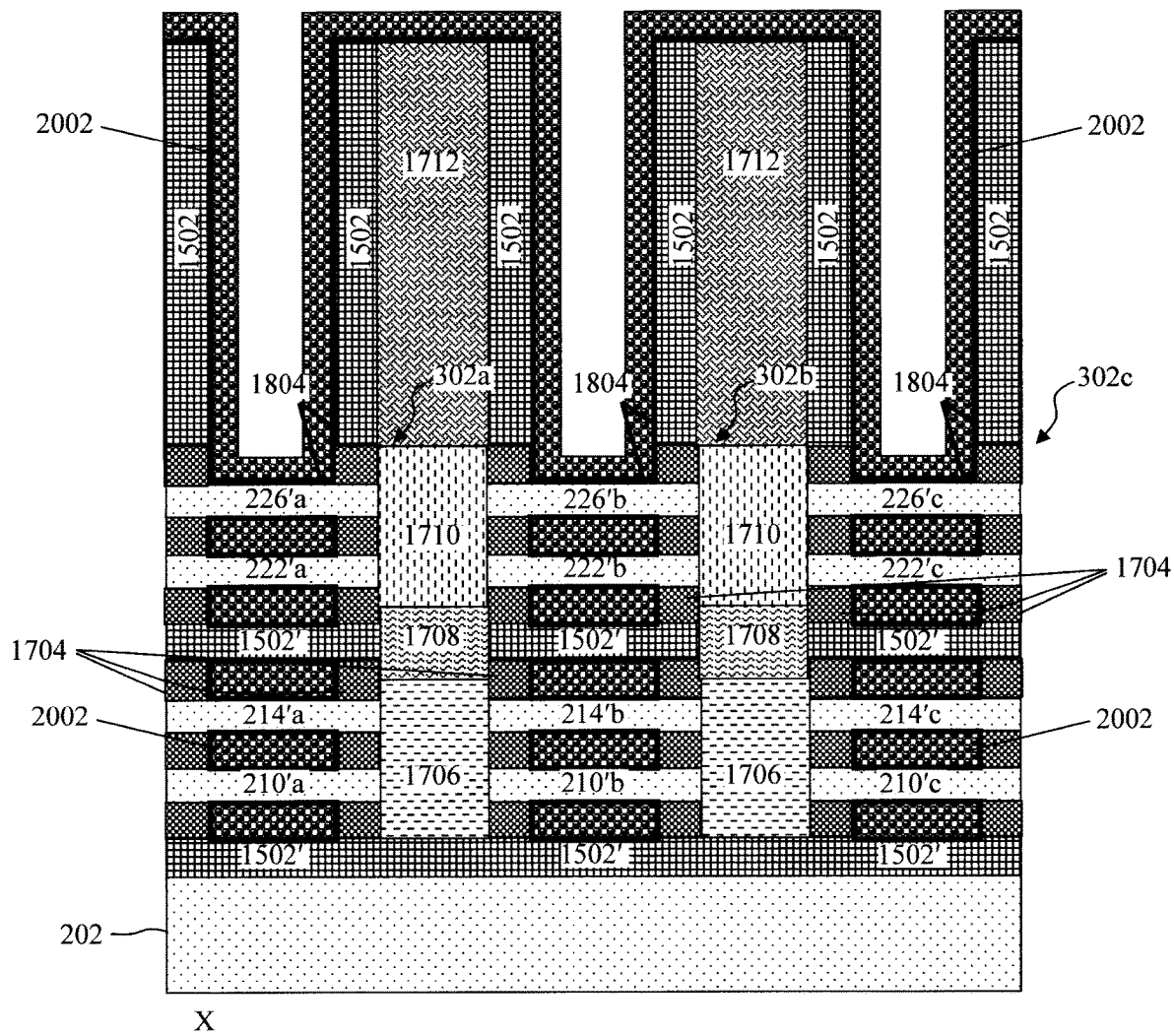
FIG. 20 is a diagram illustrating a first workfunction-setting metal having been deposited into the gate trenches and gaps on the gate dielectric from a cross-sectional view parallel to the nanosheets according to an embodiment of the present invention.

A first workfunction-setting metal 2002 is then deposited into the gate trenches 1802 and gaps on the gate dielectric 1804. See FIG. 20. FIG. 20 provides a cross-sectional view X (see FIG. 1) through the device structure. At this point in the process, the first workfunction-setting metal is disposed on the lower nanosheets 210'a,b,c, etc. and 214'a,b,c, etc. as well as the upper nanosheets 222'a,b,c, etc. and 226'a,b,c, etc. However, as will be described in detail below, this first workfunction-setting metal will subsequently be removed from the upper nanosheets 222'a,b,c, etc. and 226'a,b,c, etc. and replaced with a second workfunction-setting metal of the opposite polarity. Namely, if the first-workfunction setting metal is a p-type metal (and the lower nanosheets 210'a,b,c, etc. and 214'a,b,c, etc. are used to form a PFET device), then the second workfunction-setting metal will be an n-type metal (and the upper nanosheets 222'a,b,c, etc. and 226'a,b,c, etc. are used to form an NFET device). Alternatively, if the first-workfunction setting metal is an n-type metal (and the lower nanosheets 210'a,b,c, etc. and 214'a,b,c, etc. are used to form an NFET device), then the second workfunction-setting metal will be a p-type metal (and the upper nanosheets 222'a,b,c, etc. and 226'a,b,c, etc. are used to form a PFET device).

Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

A process such as CVD, ALD or PVD can be employed to deposit the first workfunction-setting metal 2002. Following deposition, the metal overburden can be removed using a process such as CMP. Further, it is notable that, while the instant example shows first workfunction-setting metal 2002 pinching off the gaps between the lower nanosheets 210'a,b,c, etc. and 214'a,b,c, etc. other workfunction-setting metal configurations are also contemplated herein such as the first and/or second workfunction-setting metals being composed of multiple metals and/or multiple layers of metals.

Figure 21:
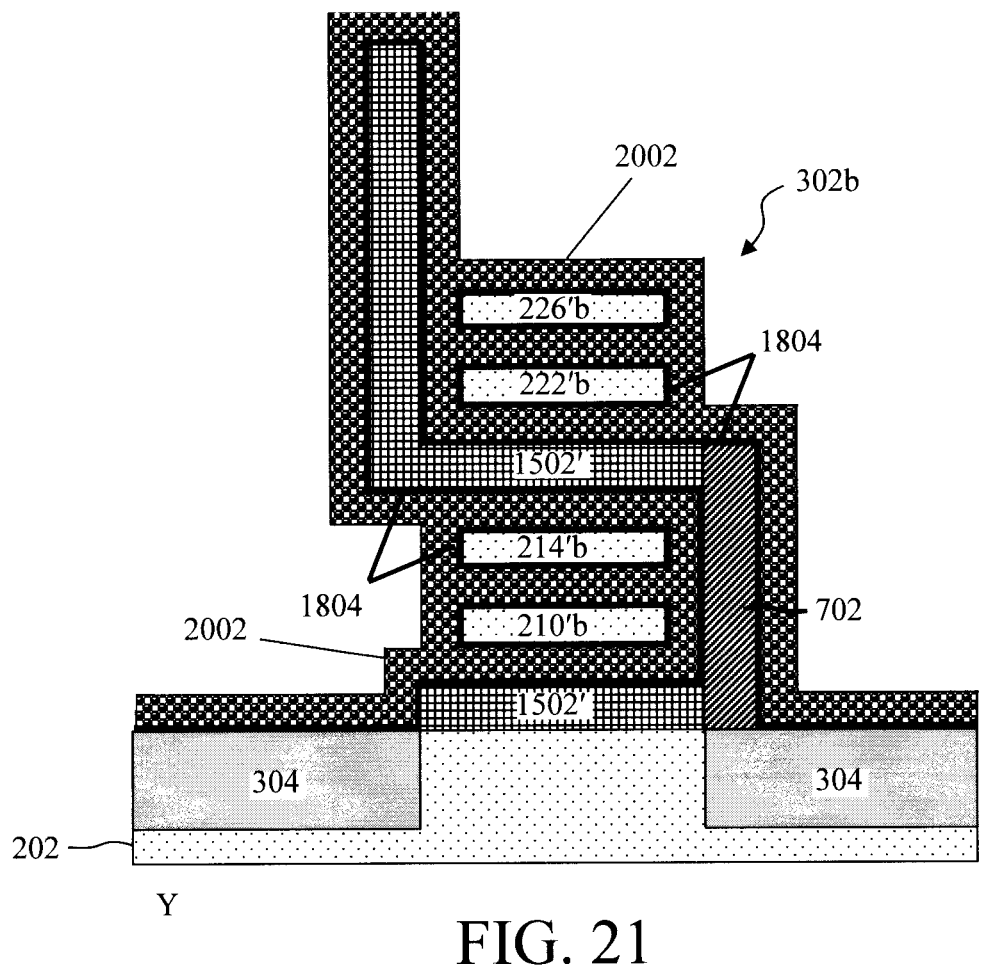
FIG. 21 is a diagram illustrating the first workfunction-setting metal having been deposited into the gate trenches and gaps on the gate dielectric from a cross-sectional view perpendicular to the nanosheets according to an embodiment of the present invention.

Deposition of first workfunction-setting metal 2002 into the gate trenches 1802 and gaps on the gate dielectric 1804 is also illustrated in FIG. 21. FIG. 21 provides a cross-sectional view Y (see FIG. 1) through the device structure. As provided above, at this point in the process the first workfunction-setting metal is disposed on the lower nanosheets 210'a,b,c, etc. and 214'a,b,c, etc. as well as the upper nanosheets 222'a,b,c, etc. and 226'a,b,c, etc. However, this first workfunction-setting metal will subsequently be removed from the upper nanosheets 222'a,b,c, etc. and 226'a,b,c, etc. and replaced with a second workfunction-setting metal of the opposite polarity.

Figure 22:
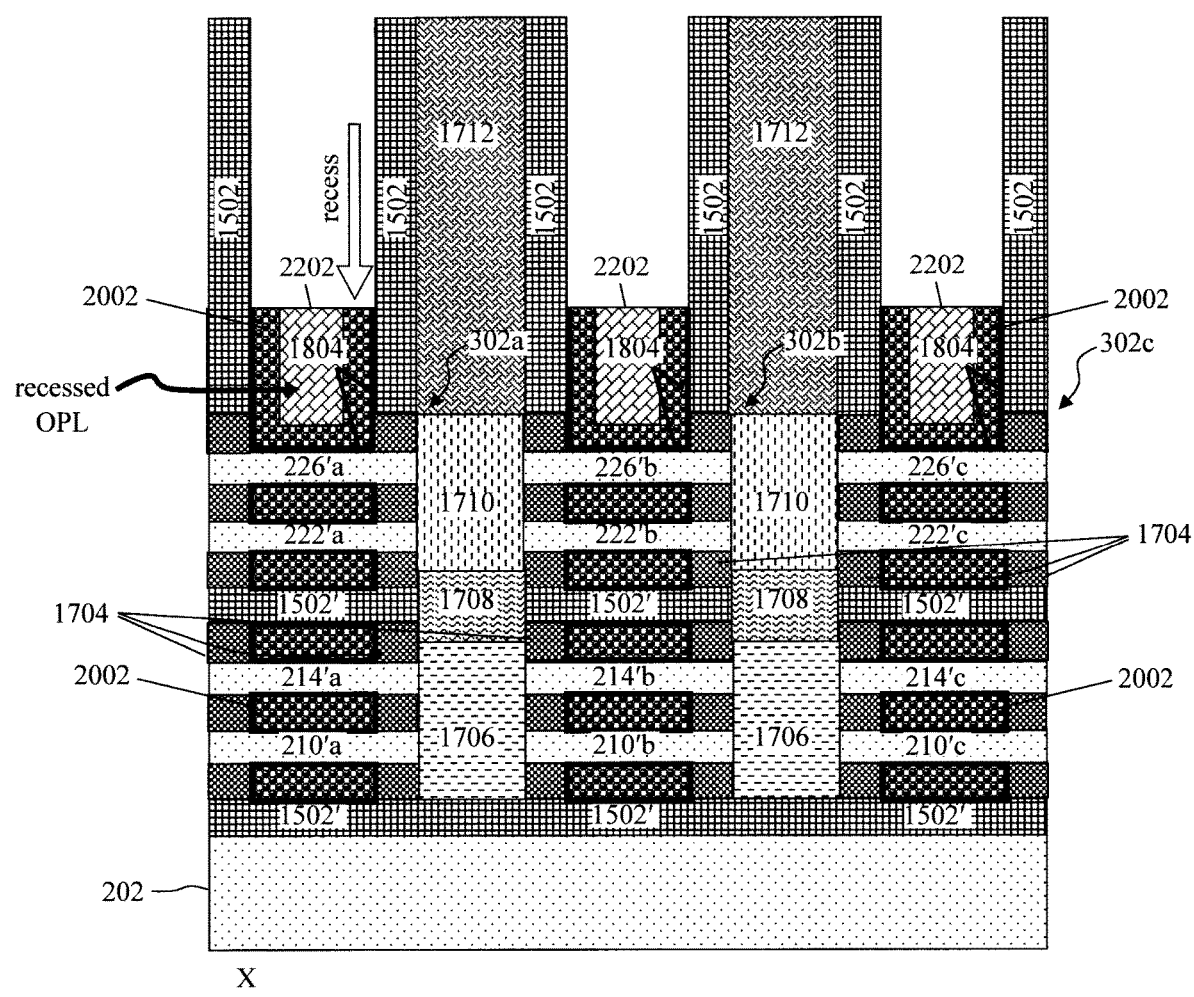
FIG. 22 is a diagram illustrating the first workfunction-setting metal and gate dielectric having been recessed in the gate trenches from a cross-sectional view parallel to the nanosheets according to an embodiment of the present invention.

To remove the first workfunction-setting metal 2002 from the upper nanosheets 222'a,b,c, etc. and 226'a,b,c, etc., the first workfunction-setting metal 2002 and gate dielectric 1804 are first recessed in the gate trenches 1802. See FIG. 22. FIG. 22 provides a cross-sectional view X (see FIG. 1) through the device structure. To do so, as shown in FIG. 22, a planarizing material 2202 such as an OPL material is deposited over the device structure and into the gate trenches 1802, and then recessed. A casting process such as spin coating or spray casting can be employed to deposit the planarizing material 2202. A directional (anisotropic) etching process such as RIE can be used to recess the planarizing material 2202. The first workfunction-setting metal 2002 and gate dielectric 1804 are then recessed (e.g., using an anisotropic etching process such as RIE) down to the (recessed) planarizing material 2202. The planarizing material 2202 is removed. By way of example only, an OPL planarizing material 2202 can be removed using a process such as ashing.

Figure 23:
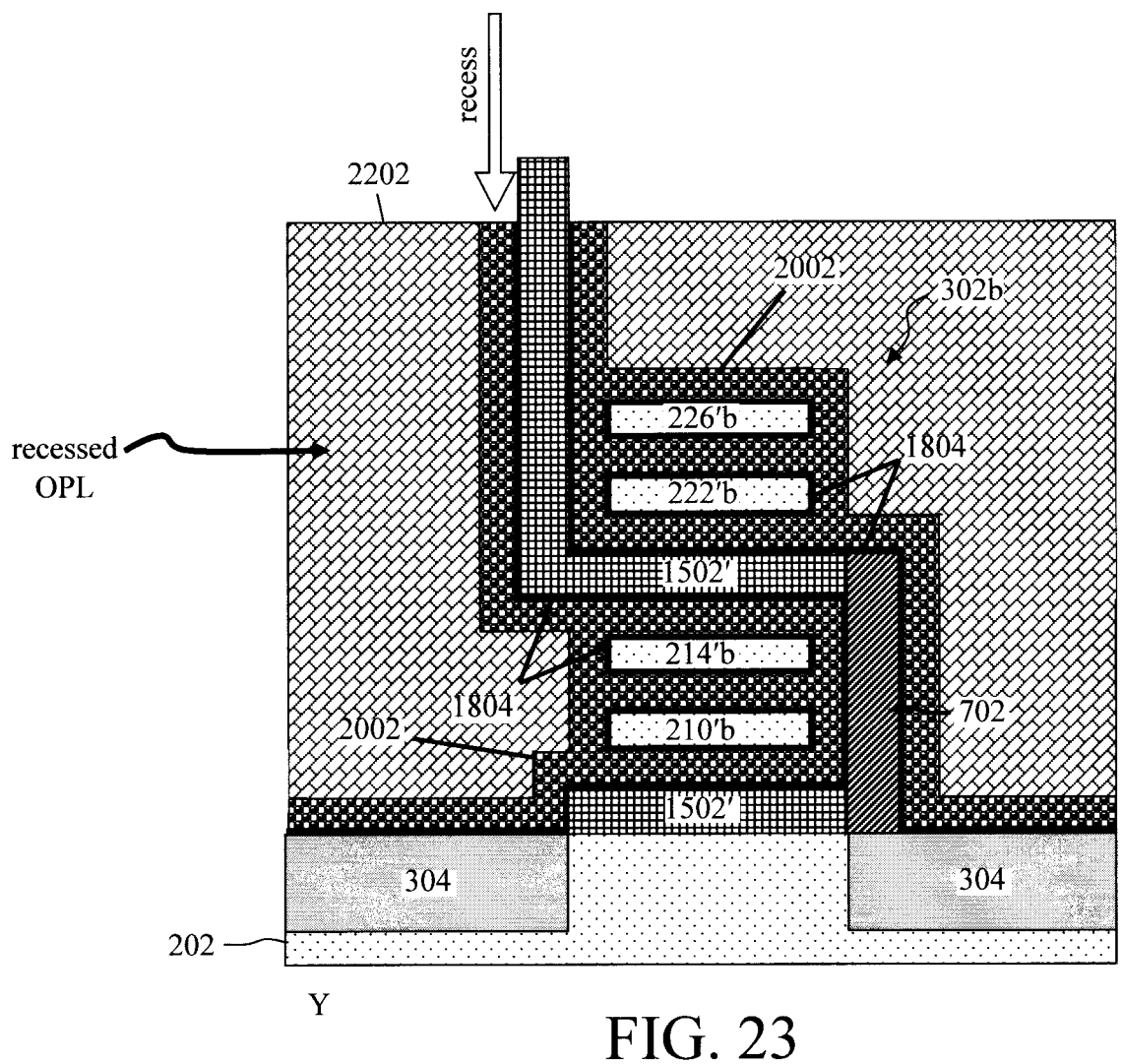
FIG. 23 is a diagram illustrating the first workfunction-setting metal and gate dielectric having been recessed in the gate trenches from a cross-sectional view perpendicular to the nanosheets according to an embodiment of the present invention.

Recess of the first workfunction-setting metal 2002 and gate dielectric 1804 in the gate trenches 1802 is also illustrated in FIG. 23. FIG. 23 provides a cross-sectional view Y (see FIG. 1) through the device structure.

Figure 24:
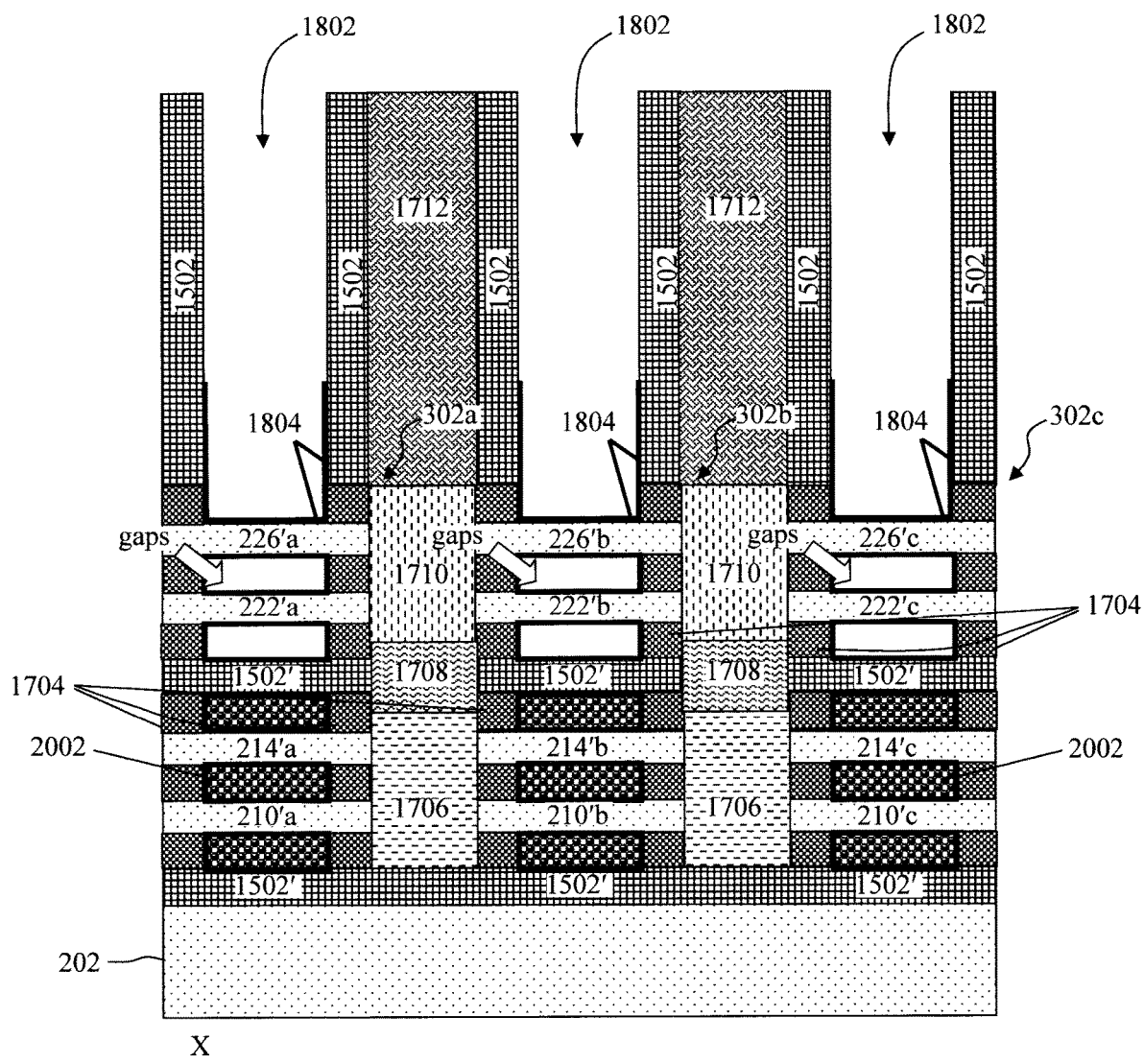
FIG. 24 is a diagram illustrating the first workfunction-setting metal having been removed from the upper nanosheets reopening the gate trenches and gaps in the upper CFET stacks from a cross-sectional view parallel to the nanosheets according to an embodiment of the present invention.

The first workfunction-setting metal 2002 is then removed from the upper nanosheets 222'a,b,c, etc. and 226'a,b,c, etc. See FIG. 24. FIG. 24 provides a cross-sectional view X (see FIG. 1) through the device structure. A recess etch is used to remove the first workfunction-setting metal 2002 from the upper nanosheets 222'a,b,c, etc. and 226'a,b,c, etc. As will be described in conjunction with the description of FIG. 25 below, a block mask is used to cover/mask the first workfunction-setting metal 2002 disposed on the lower nanosheets 210'a,b,c, etc. and 214'a,b,c, etc. This block mask is, however, not visible in the view depicted in FIG. 24.

According to an exemplary embodiment, the recess etch of the first workfunction-setting metal 2002 is performed using a non-directional (isotropic) metal-selective etching process. For instance, an SC1 wet clean (e.g., hydrofluoric acid (HF) and a hydrogen peroxide ($H_2O_2$):ammonium hydroxide ($NH_4OH$) mixture) can be employed to recess the workfunction-setting metal selective to the gate dielectric 1804. Notably, the dielectric spacers 1502' prevent damage to the underlying first workfunction-setting metal 2002 disposed on the lower nanosheets 210'a,b,c, etc. and 214'a,b,c, etc. due to undercut during the recess etch.

Figure 25:
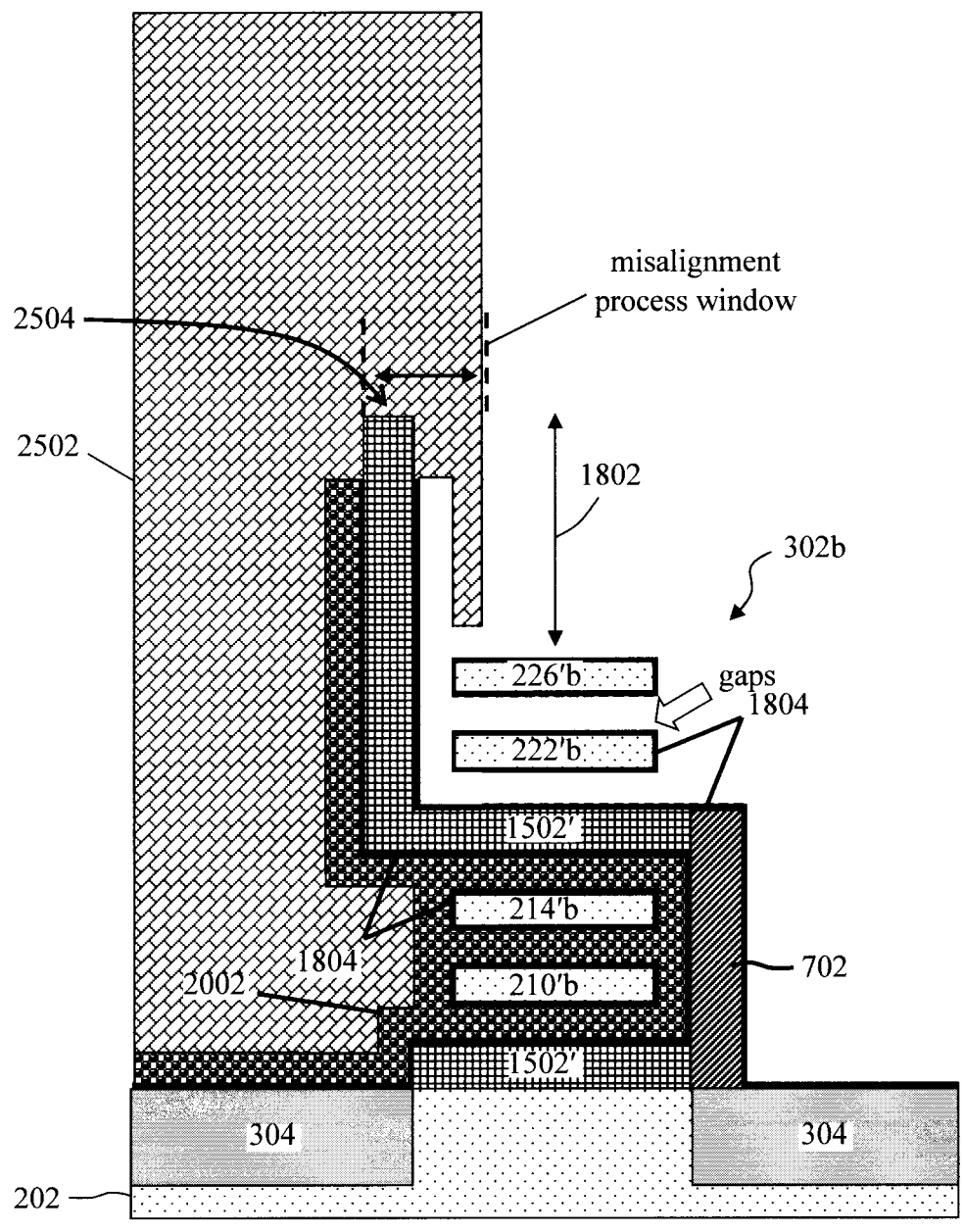
FIG. 25 is a diagram illustrating a block mask having been formed on the CFET stacks covering the first workfunction-setting metal disposed on the lower nanosheets, and the first workfunction-setting metal having been removed from the upper nano sheets reopening the gate trenches and gaps in the upper CFET stacks from a cross-sectional view perpendicular to the nanosheets according to an embodiment of the present invention.

Removal of the first workfunction-setting metal 2002 from the upper nanosheets 222'a,b,c, etc. and 226'a,b,c, etc. is also shown in FIG. 25. FIG. 25 provides a cross-sectional view Y (see FIG. 1) through the device structure. As shown in FIG. 25, a block mask 2502 is formed on the CFET stacks 302a,b,c, etc. covering/masking the first workfunction-setting metal 2002 disposed on the lower nanosheets 210'a,b,c, etc. and 214'a,b,c, etc. Block mask 2502 leaves the first workfunction-setting metal 2002 disposed on the upper nanosheets 222'a,b,c, etc. and 226'a,b,c, etc. exposed (uncovered). Suitable block mask materials include, but are not limited to, an OPL material, which can be deposited onto the CFET stacks 302a,b,c, etc. using a casting process such as spin-coating or spray casting.

Ideally, block mask 2502 lands on surface 2504 of dielectric spacers 1502' in order to fully expose the first workfunction-setting metal 2002 disposed on the upper nanosheets 222'a,b,c, etc. and 226'a,b,c, etc. However, as shown in FIG. 25, it is notable that there is advantageously a large misalignment process window and that block mask 2502 can in fact extend past surface 2504 of dielectric spacers 1502' and partially cover the upper nanosheets 222'a,b,c, etc. and 226'a,b,c, etc. without consequence. Namely, the above-described isotropic etching process can still effectively remove the first workfunction-setting metal 2002 from the upper nanosheets 222'a,b,c, etc. and 226'a,b,c, etc. while the dielectric spacers 1502' and block mask 2502 prevent damage to the underlying first workfunction-setting metal 2002 disposed on the lower nanosheets 210'a,b,c, etc. and 214'a,b,c, etc. Following the recess etch, block mask 2502 is removed. By way of example only, an OPL block mask 2502 can be removed using a process such as ashing.

Figure 26:
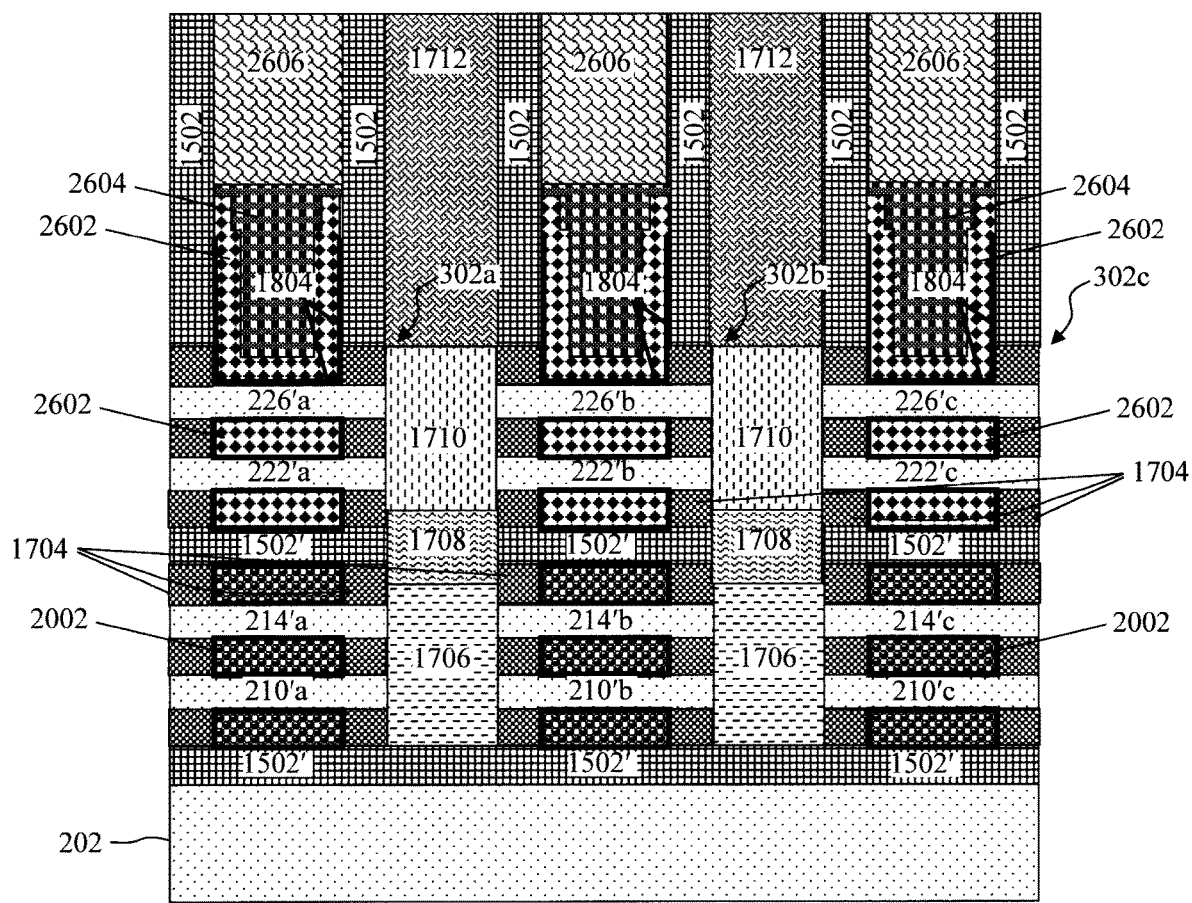
FIG. 26 is a diagram illustrating a second workfunction-setting metal having been deposited into the gate trenches and gaps on the gate dielectric and recessed, a low-resistivity gate fill metal having been deposited into the gate trenches over the second workfunction-setting metal and recessed, and a dielectric cap having been deposited into the gate trenches over the gate fill metal from a cross-sectional view parallel to the nanosheets according to an embodiment of the present invention.

As shown in FIGS. 24 and 25, removal of the first workfunction-setting metal 2002 from the upper nanosheets 222'a,b,c, etc. and 226'a,b,c, etc. reopens the gate trenches 1802 and gaps in the upper CFET stacks 302a,b,c, etc. A second workfunction-setting metal 2602 is then deposited into the gate trenches 1802 and gaps on the gate dielectric 1804. See FIG. 26. FIG. 26 provides a cross-sectional view X (see FIG. 1) through the device structure. As provided above, if the first-workfunction setting metal is a p-type metal (and the lower nanosheets 210'a,b,c, etc. and 214'a,b,c, etc. are used to form a PFET device), then the second workfunction-setting metal will be an n-type metal (and the upper nanosheets 222'a,b,c, etc. and 226'a,b,c, etc. are used to form an NFET device). Alternatively, if the first-workfunction setting metal is an n-type metal (and the lower nanosheets 210'a,b,c, etc. and 214'a,b,c, etc. are used to form an NFET device), then the second workfunction-setting metal will be a p-type metal (and the upper nanosheets 222'a,b,c, etc. and 226'a,b,c, etc. are used to form a PFET device). Suitable n-type workfunction-setting metals and p-type workfunction-setting metals were provided above.

A process such as CVD, ALD or PVD can be employed to deposit the second workfunction-setting metal 2602. Following deposition, the metal overburden can be removed using a process such as CMP. Further, it is notable that, while the instant example shows second workfunction-setting metal 2602 pinching off the gaps between the upper nanosheets 222'a,b,c, etc. and 226'a,b,c, etc. other workfunction-setting metal configurations are also contemplated herein such as the first and/or second workfunction-setting metals being composed of multiple metals and/or multiple layers of metals. As shown in FIG. 26, following deposition the second workfunction-setting metal 2602 is recessed in the gate trenches 1802. The process for recessing the workfunction-setting metal in this manner, i.e., using a planarizing material such as an OPL, was described in detail above in conjunction with the description of FIG. 22.

A low-resistivity gate fill metal 2604 is then deposited into the gate trenches 1802 over the second workfunction-setting metal 2602 and recessed. Suitable low-resistivity gate fill metals include, but are not limited to, TiN and/or W. A process such as CVD, ALD or PVD can be employed to deposit the low-resistivity gate fill metal 2604 into the gate trenches 1802.

A dielectric cap 2606 is then deposited into the gate trenches 1802 over the gate fill metal 2604. Suitable materials for dielectric cap 2606 include, but are not limited to, SiOx, SiN, SiON, and/or SiCN. A process such as CVD, ALD or PVD can be employed to deposit the dielectric cap 2606 material into the gate trenches 1802. Following deposition, the dielectric cap 2606 material can be planarized using a process such as CMP.

Figure 27:
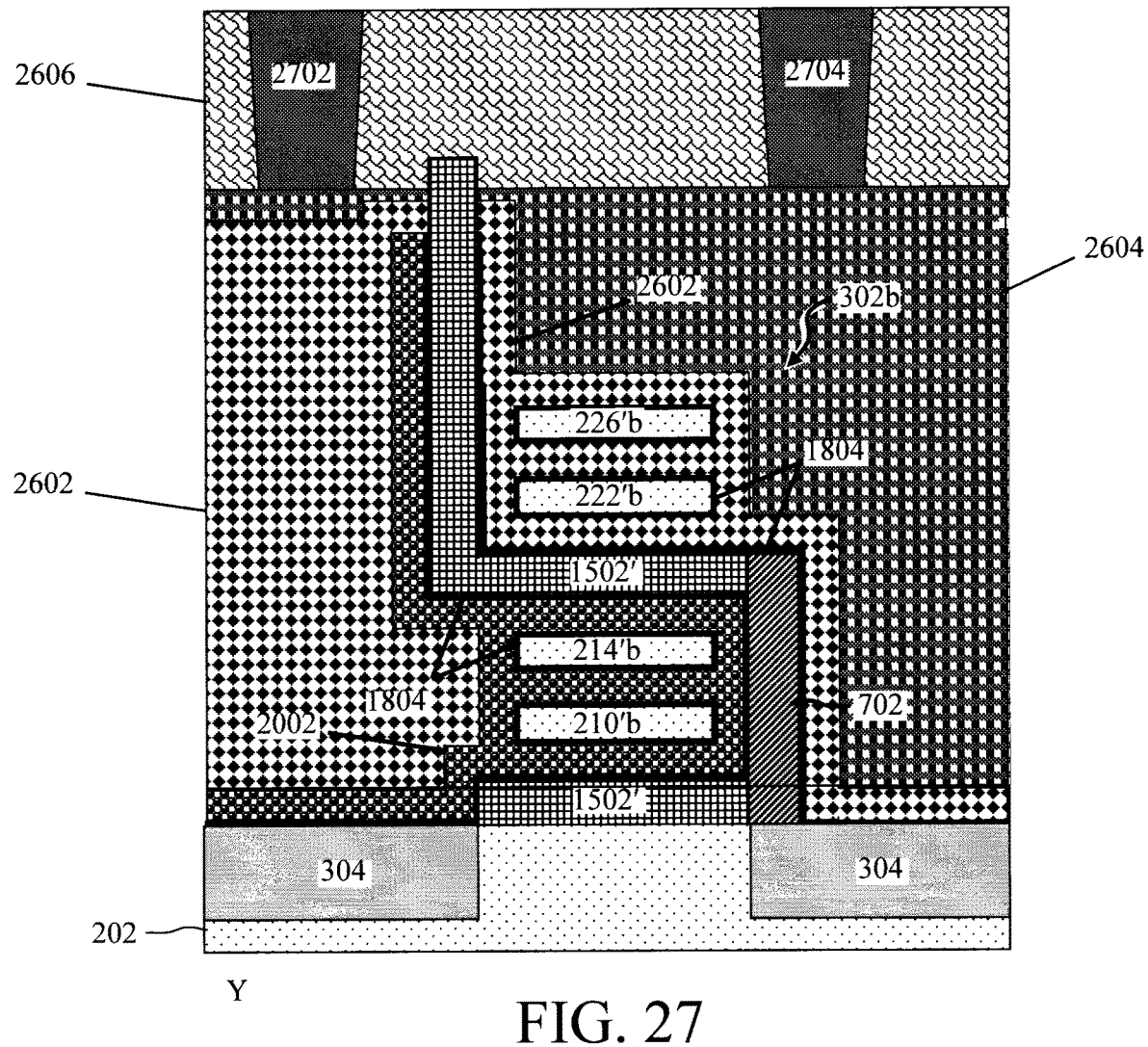
FIG. 27 is a diagram illustrating the second workfunction-setting metal having been deposited into the gate trenches and gaps on the gate dielectric and recessed, the low-resistivity gate fill metal having been deposited into the gate trenches over the second workfunction-setting metal and recessed, the dielectric cap having been deposited into the gate trenches over the gate fill metal, and gate contacts having been formed in the dielectric cap from a cross-sectional view perpendicular to the nanosheets according to an embodiment of the present invention.

Deposition of the second workfunction-setting metal 2602, low-resistivity gate fill metal 2604 and dielectric cap 2606 into the gate trenches 1802 is also illustrated in FIG. 27. FIG. 27 provides a cross-sectional view Y (see FIG. 1) through the device structure. FIG. 27 illustrates how, as described in detail above, the present ζ-shaped dielectric spacer (formed by dielectric spacers 1502' and (first) sidewall spacer 702) provides dielectric separation between the first workfunction-setting metal 2002 and the second workfunction-setting metal 2602. Further, the gate dielectric 1804 and first workfunction-setting metal 2002 form a first RMG that fully surrounds a portion of each of the lower nanosheets 210'a,b,c, etc. and 214'a,b,c, etc. which form the channels of the lower FET device in a gate-all-around configuration, while the gate dielectric 1804 and second workfunction-setting metal 2602 form a second RMG that fully surrounds a portion of each of the upper nanosheets 222'a,b,c, etc. and 226'a,b,c, etc. which form the channels of the upper FET device in a gate-all-around configuration. Referring briefly back to FIG. 26, as highlighted above, inner spacers 1704 offset these first/second RMGs from the lower source and drains 1706 and the upper source and drains 1710, respectively.

As shown in FIG. 27, gate contacts 2702 and 2704 can then be formed in the dielectric cap 2606 to each of the PFET and NFET devices. For instance, if the first workfunction-setting metal 2002 is a p-type metal (i.e., the lower nanosheets 210'a,b,c, etc. and 214'a,b,c, etc. are used to form a PFET device) and the second workfunction-setting metal 2602 is an n-type metal (i.e., the upper nanosheets 222'a,b,c, etc. and 226'a,b,c, etc. are used to form an NFET device), then gate contacts 2702 and 2704 are PFET and NFET gate contacts respectively. Alternatively, if the first workfunction-setting metal 2002 is an n-type metal (i.e., the lower nanosheets 210'a,b,c, etc. and 214'a,b,c, etc. are used to form an NFET device) and the second workfunction-setting metal 2602 is a p-type metal (i.e., the upper nanosheets 222'a,b,c, etc. and 226'a,b,c, etc. are used to form a PFET device), then gate contacts 2702 and 2704 are NFET and PFET gate contacts respectively.

To form the gate contacts 2702 and 2704, standard lithography and etching techniques can be employed to first pattern trenches in the dielectric cap 2606. The trenches are then filled with a contact metal(s) to form the gate contacts 2702 and 2704. Suitable contact metals include, but are not limited to, copper (Cu), cobalt (Co), ruthenium (Ru) and/or tungsten (W). The contact metal(s) can be deposited using a process such as evaporation, sputtering or electrochemical plating. Following deposition, the metal overburden can be removed using a process such as CMP. Prior to depositing the contact metal(s) into the trenches, a conformal barrier layer (not shown) can be deposited into and lining the trenches. Use of such a barrier layer helps to prevent diffusion of the contact metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining the trenches prior to contact metal deposition. A seed layer facilitates plating of the contact metal into the trenches.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a complementary field effect transistor (CFET) device, the method comprising the steps of:
    forming at least one nanosheet device stack on a substrate comprising alternating first nanosheets of a first material and second nanosheets of a second material, wherein lower nanosheets in the at least one nanosheet device stack are separated from the substrate and from upper nanosheets in the at least one nanosheet device stack by sacrificial nanosheets;
    forming a dielectric isolation spacer separating the lower nanosheets from the upper nanosheets, wherein the dielectric isolation spacer comprises at least an upper vertical portion and a lower vertical portion connected by a horizontal portion;
    forming lower source and drains on opposite sides of the lower nanosheets and upper source and drains on opposite sides of the upper nanosheets, separated from the lower source and drains by an isolation spacer;
    selectively removing the first nanosheets, forming gaps in the lower nanosheets and the upper nanosheets; and
    forming a first gate in the gaps fully surrounding a portion of each of the lower nanosheets in a gate-all-around configuration comprising at least one first workfunction-setting metal, and a second gate in the gaps fully surrounding a portion of each of the upper nanosheets in a gate-all-around configuration comprising at least one second workfunction-setting metal, wherein the at least one first workfunction-setting metal is separated from the at least one second workfunction-setting metal by the dielectric isolation spacer, wherein the at least one first workfunction-setting metal separates the lower nanosheets from the lower vertical portion of the dielectric isolation spacer, and wherein the at least one second workfunction-setting metal separates the upper nanosheets from the upper vertical portion of the dielectric isolation spacer.

2. The method of claim 1, wherein the first material comprises silicon germanium (SiGe), and wherein the second material comprises silicon (Si).

3. The method of claim 2, wherein the SiGe has a germanium (Ge) content of from about 20% Ge to about 50% Ge and ranges therebetween.

4. The method of claim 1, wherein the sacrificial nanosheets comprise SiGe having a Ge content of from about 50% Ge to about 100% Ge and ranges therebetween.

5. The method of claim 1, further comprising the steps of:
    forming a first sidewall spacer selectively alongside the sacrificial nanosheets and the lower nanosheets on a second side of the at least one nanosheet device stack;

forming a second sidewall spacer selectively alongside the upper nanosheets on a first side of the at least one nanosheet device stack;

forming sacrificial gates on the at least one nanosheet device stack over channel regions of the CFET device;

selectively removing the sacrificial nanosheets and the second sidewall spacer, forming openings in the at least one nanosheet device stack and the sacrificial gates; and forming dielectric spacers alongside the sacrificial gates and within the openings, wherein the dielectric spacers within the openings and the first sidewall spacer form the dielectric isolation spacer separating the lower nanosheets from the upper nanosheets.

6. The method of claim 5, wherein the first sidewall spacers comprise a material selected from the group consisting of: silicon carbide (SiC), silicon oxycarbide (SiCO), and combinations thereof.

7. The method of claim 5, wherein the second sidewall spacers comprise a material selected from the group consisting of: titanium oxide (TiO), tantalum oxide (TaO), SiGe having a Ge content of from about 60% Ge to about 100% Ge and ranges therebetween, and combinations thereof.

8. The method of claim 5, wherein the dielectric spacers comprise a material selected from the group consisting of: silicon oxide (SiOx), SiC, SiCO, and combinations thereof.

9. The method of claim 5, further comprising the steps of:
patterning trenches in the at least one nanosheet device stack in between the sacrificial gates; and
forming the lower source and drains in the trenches on the opposite sides of the lower nanosheets and the upper source and drains in the trenches on the opposite sides of the upper nanosheets, separated from the lower source and drains by the isolation spacer.

10. The method of claim 9, wherein the step of patterning the trenches in the at least one nanosheet device stack forms individual CFET stacks, the method further comprising the steps of:
selectively recessing the first nanosheets, forming pockets along sidewalls of the CFET stacks; and
forming inner spacers within the pockets.

11. The method of claim 5, further comprising the steps of:
surrounding the sacrificial gates in an interlayer dielectric (ILD);
selectively removing the sacrificial gates, forming gate trenches in the ILD; and
selectively removing the first nanosheets through the gate trenches, forming the gaps in the lower nanosheets and the upper nanosheets.

12. The method of claim 1, further comprising the steps of:
etching the sacrificial nanosheets to form divots adjacent to the sacrificial nanosheets along sidewalls of the at least one nanosheet device stack; and
forming sacrificial spacers in the divots.

13. The method of claim 12, wherein the sacrificial spacers comprise a material selected from the group consisting of: titanium oxide (TiO), tantalum oxide (TaO), and combinations thereof.

14. The method of claim 12, further comprising the steps of:
laterally trimming the lower nanosheets and the upper nanosheets in the stack; and
epitaxially growing the first material along the sidewalls of the at least one nanosheet device stack to fully surround the second nanosheets in the first material.

15. The method of claim 1, wherein either the first workfunction-setting metal comprises a p-type workfunction-setting metal and the second workfunction-setting metal comprises an n-type workfunction-setting metal, or the first workfunction-setting metal comprises an n-type workfunction-setting metal and the second workfunction-setting metal comprises a p-type workfunction-setting metal.

16. The method of claim 1, further comprising the step of:
forming shallow trench isolation (STI) regions in the substrate at a base of the at least one nanosheet device stack.

17. A CFET device, comprising:
at least one nanosheet device stack disposed on a substrate;
a dielectric isolation spacer separating lower nanosheets in the at least one nanosheet device stack from upper nanosheets in the least one nanosheet device stack, wherein the dielectric isolation spacer comprises at least an upper vertical portion and a lower vertical portion connected by a horizontal portion;
lower source and drains on opposite sides of the lower nanosheets and upper source and drains on opposite sides of the upper nanosheets, separated from the lower source and drains by an isolation spacer; and
a first gate fully surrounding a portion of each of the lower nanosheets in a gate-all-around configuration comprising at least one first workfunction-setting metal, and a second gate fully surrounding a portion of each of the upper nanosheets in a gate-all-around configuration comprising at least one second workfunction-setting metal, wherein the at least one first workfunction-setting metal is separated from the at least one second workfunction-setting metal by the dielectric isolation spacer, wherein the at least one first workfunction-setting metal separates the lower nanosheets from the lower vertical portion of the dielectric isolation spacer, and wherein the at least one second workfunction-setting metal separates the upper nanosheets from the upper vertical portion of the dielectric isolation spacer.

18. The CFET device of claim 17, wherein the lower nanosheets and the upper nanosheets comprise Si.

19. The CFET device of claim 17, wherein either the first workfunction-setting metal comprises a p-type workfunction-setting metal and the second workfunction-setting metal comprises an n-type workfunction-setting metal, or the first workfunction-setting metal comprises an n-type workfunction-setting metal and the second workfunction-setting metal comprises a p-type workfunction-setting metal.

20. The CFET device of claim 17, further comprising:
inner spacers that offset i) the first gate from the lower source and drains and ii) the second gate from the upper source and drains.

* * * * *